US006391527B2

(12) United States Patent
Yagi et al.

(10) Patent No.: US 6,391,527 B2
(45) **Date of Patent: *May 21, 2002**

(54) METHOD OF PRODUCING MICRO STRUCTURE, METHOD OF PRODUCTION LIQUID DISCHARGE HEAD

(75) Inventors: Takayuki Yagi, Yokohama; Tomoyuki Hiroki, Zama; Teruo Ozaki, Yokohama; Masahiko Kubota, Tokyo, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,409

(22) Filed: Apr. 13, 1999

(30) Foreign Application Priority Data

Apr. 16, 1998 (JP) .......................................... 10-106295
Apr. 16, 1998 (JP) .......................................... 10-106298

(51) Int. Cl.[7] ................................................ G03F 7/00

(52) U.S. Cl. ....................... 430/313; 430/314; 430/316; 430/317; 430/318

(58) Field of Search ................................ 430/313, 314, 430/316, 317, 318

(56) References Cited

U.S. PATENT DOCUMENTS 5,665,253 A * 9/1997 Kubena ....................... 216/41

FOREIGN PATENT DOCUMENTS

| | | |
|---|---|---|
| EP | 0 665 590 A2 | 8/1995 |
| EP | 0 819 532 A2 | 1/1998 |
| EP | 0 895 861 A1 | 2/1999 |
| GB | 2 306 399 A | 5/1997 |
| JP | 9-11471 * | 1/1997 |

OTHER PUBLICATIONS

L.Y. Lin, et al., "Micromachined Integrated Optics for Free–Space Interconnections", Proceedings of IEEE Micro Electro Mechanical Systems Workshop, 1995, pp. 77–82.

L.C. Kon, et al., "Integrated Electrostatically Resonant Scan Tip for an Atomic Force Microscope", J. Vac. Sci. Technol. B, vol. 11, No. 3, 1993, pp. 634–641.

D. Kobayashi, et al., "An Integrated Lateral Tunneling Unit", IEEE Micro Electro Mechanical Systems Workshop, 1992, pp. 214–219.

M. Mehregany, et al., "Operation of Microfabricated Harmonic and Ordinary Side–Drive Motors", Proceedings of IEEE Micro Electro Mechanical Systems Workshop, 1990, pp. 1–8.

* cited by examiner

*Primary Examiner*—Mark F. Huff
*Assistant Examiner*—Nicole Barreca
(74) *Attorney, Agent, or Firm*—Fitzpatrick, Cella, Harper & Scinto

(57) ABSTRACT

A method of producing a micro structure on a substrate which has a support portion and a plate-like portion supported thereby at a distance from the substrate, comprising the steps of forming a spacer layer consisting of an insulating material on a substrate having an electrically conductive layer formed on its surface, forming a latent image layer consisting of an electrically conductive material on the spacer layer at a site where the plate-like portion of an intended structure is to be formed, producing an aperture, where a part of the electrically conductive layer is exposed, on the spacer layer at a site where the supporting portion of an intended structure is to be formed, forming a structure layer consisting of plating film inside of the aperture and on the latent image layer by electroplating the electrically conductive layer as a cathode, and removing the spacer layer.

13 Claims, 16 Drawing Sheets

METHOD OF PRODUCING MICRO STRUCTURE, METHOD OF PRODUCTION LIQUID DISCHARGE HEAD

BACKGROUND OF THE INVENTION

1. Field of the Invention

The present invention relates to a method of producing a micro structure using a micro mechanics, particularly to a method of producing a micro structure using electroplating, a method of producing a liquid discharge head, a liquid discharge head produced thereby, a head cartridge loaded with said liquid discharge head, and a device for discharging liquid produced therewith.

2. Related Background Art

In recent years, a micro machine having a small movable mechanism has been investigated by using micro mechanics techniques. Especially, a micro structure produced by using a semiconductor integrated circuit production technique (semiconductor photo lithography process) makes it possible to produce on a substrate a plurality of micro machine parts which are more miniaturized and highly reproductive. Accordingly, this provides relatively easier arraying and lower production costs, in addition, with such miniaturization, and more rapid responsibility can be expected as compared with conventional mechanical structures.

Of the micro mechanics techniques using a semiconductor photo lithography process, surface micro-machining which uses a sacrifice layer is a method in which micro structures such as a micro cantilever, a linear actuator or the like can be easily made on a substrate, and various devices have been developed using this process.

Two typical surface micro-machining methods which use a sacrifice layer will be described below.

A first surface micro-machining method is such that a poly silicon film or an SOI (Si on Insulator) film, formed into a thin layer through a silicon dioxide film on a silicon substrate, which is to become a micro structure is patterned in a desired shape and then the oxidizing film of silicon dioxide is removed with an aqueous solution of hydrofluoric acid. With this method, a linear actuator (D. Kobayashi et al., "An Integrated Lateral Tunneling Unit," Proceedings of IEEE Micro Electro Mechanical Systems Workshop 1992, pp.214–219) or the like can be manufactured. In this method, a sacrifice layer for use in producing micro structures is a single layer common to all of the structures.

FIGS. 5A to 5E are diagrammatic illustrations of the production process of micro structures using this method. First, a silicon dioxide film 511 as a sacrifice layer, a poly silicon film 513 as a structure layer and a nickel mask layer 514 are formed on a substrate 512 in this order (FIG. 5A). The nickel mask layer 514 is then patterned, and using this as a mask, the poly silicon film 513 is etched to produce micro structures A, B and C comprising the poly silicon film 513 (FIG. 5B). After this, the nickel mask layer 514 is removed to allow the poly silicon film 513 to be exposed (FIG. 5C), then the silicon dioxide film 511 is etched with an aqueous solution of hydrofluoric acid. This produces a void below the central micro structure B, as shown in FIG. 5D. And in the micro structures A and C on both sides of the micro structure B, the silicon dioxide film 511 which supports both A and C is side-etched to have a cantilever shape. Lastly, a metal film 515 which is a laminate of Cr and Au in this order is deposited on the surface of each of the structures A, B and C so as to produce electrically conductive micro structures A, B and C (FIG. 5E).

A second surface micro-machining method is such that micro structures are produced on the sacrifice layer, which has been formed into a desired pattern, by the thin-film formation process. With this method, a wharve micro motor (M. Mehregany et al., "Operation of microfabricated harmonic and ordinary side-drive motors," Proceedings IEEE Micro Electro Mechanical Systems Workshop 1990, pp.1 to 8), a cantilever (L. C. Kong et al., Integrated electrostatically resonant scan tip for an atomic force microscope" J. Vac. Sci. Technol. Bll(3), p.634, 1993) or the like can be produced.

FIGS. 6A to 6D illustrate the production process of a cantilever using this method. First, a sacrifice film layer 611 is formed on a silicon substrate 612 having a passivation layer 614 formed on it, after which the sacrifice layer 611 is patterned by using semiconductor photo lithography techniques and etching (FIG. 6A). A structure layer 613, which is to become micro structures, is then formed on the substrate 612 (FIG. 6B), and the structure layer 613 is patterned to have a desired shape using semiconductor photo lithography techniques and etching (FIG. 6C). Then the sacrifice layer 611 is etched with an etchant capable of removing the sacrifice layer 611 alone so as to produce a cantilever 612 shown in FIG. 6D. With this method, more complicated structures can be produced by forming a plurality of sacrifice layers and structure layers. (L. Y. Lin et al., "Micromachined Integrated Optics for Free-Space Interconnections," Proceedings of IEEE Micro Electro Mechanical Systems Workshop 1995, pp.77 to 82).

SUMMARY OF THE INVENTION

The conventional methods of producing a micro structure mentioned above, however, have problems as follows.

First, in the first method shown in FIGS. 5A to 5E, the length of the micro structures A and C on both sides depends on the etching conditions of the silicon dioxide film 511, therefore the varying concentration, temperature and agitation of etching reagent may cause its variation. The variation of the length of a micro structure results in variation of mechanical properties, such as spring constant, resonance frequency, etc., of the cantilever and joist or the like which are connected to the structure. Thus, this method leads to a reduction in reproductivity of micro structures.

On the other hand, when the displacement of a cantilever is caused by external force, the stress typically concentrates on the base of the cantilever. In case of the cantilever 621 produced in the manner shown in FIGS. 6A to 6D, the stress concentrates on an inflection portion 622. The substrate bottom side of such an inflection portion becomes a concentration part of the stress D which is excessively strained, therefore deterioration in its mechanical strength with time tends to occur at that portion, which allows its breaking due to mechanical metal fatigue to easily occur.

The present invention has been made in light of such difficulties the foregoing prior arts have, and therefore, the object of the present invention is to provide a method of producing a micro structure of which (1) variation in mechanical properties is small, and (2) deterioration in its mechanical strength with time due to the stress concentration at the inflection portion can be controlled.

In order to attain the above object, one aspect of the present invention provides a method of producing a micro structure on a substrate which has a support portion and a plate-like portion supported thereby at a distance from the substrate, comprising the steps of:

forming a spacer layer consisting of an insulating material on a substrate having an electrically conductive layer formed on its surface, forming a latent image layer consisting of an electrically conductive material on the spacer layer at a site where the plate-like portion of a structure is to be formed, producing an aperture, where a part of the electrically conductive layer is exposed, on the spacer layer at a site where the supporting portion of a structure is to be formed, forming a structure layer consisting of plating film inside of the aperture and on the latent image layer by electroplating the electrically conductive layer as a cathode, and removing the spacer layer.

Another aspect of the present invention provides a method of producing a liquid discharge head for discharging liquid from a discharge port, wherein the liquid discharge head has at least a discharge port for discharging liquid, a liquid flow path in communication with the discharge port for supplying the liquid to the discharge port, a substrate provided with a heating element for allowing the liquid filled in the liquid flow path to generate bubble, and a movable member supported by and fixed to the substrate at a position apart from the substrate and opposite to the heating elements with its free end toward the discharge port, and the liquid discharge head discharges the liquid from the discharge port by having the free end of the movable member displaced toward the discharge port around a supporting point constructed in the neighborhood of the portion where the movable member is supported by and fixed to the substrate by pressure generated by the bubble generation, characterized in that the method comprises the steps of:

forming an electrically conductive layer consisting of an electrically conductive material on the top layer of the substrate, forming a spacer layer for making the void on the electrically conductive layer, forming a latent image layer consisting of an electrically conductive material on the spacer layer so that the latent image layer can have almost the same shape as the movable member, removing a portion of the spacer layer corresponding to the portion where the movable member is supported and fixed, so as to expose a part of the electrically conductive layer so as to form an aperture on the more upstream side of the liquid flow path, in terms of liquid flow direction, relative to the latent image layer, forming a metal plating layer constituting the movable member on the electrically conductive layer as well as on the latent image layer by electroplating using the electrically conductive layer as a cathode, and forming the movable member by removing the spacer layer.

Further, another aspect of the invention provides a liquid discharge head, wherein the liquid discharge head has at least a discharge port for discharging liquid, a liquid flow path in communication with the discharge port for supplying the liquid to the discharge port, a substrate provided with a heating element for allowing the liquid filled in the liquid flow path to generate bubble, and a movable member supported by and fixed to the substrate at a position apart from the substrate and opposite to the heating element with its free end toward the discharge port, and the liquid discharge head discharges the liquid from the discharge port by having the free end of the movable member displaced toward the discharge port around a supporting point constructed in the neighborhood of the portion where the movable member is supported by and fixed to the substrate by pressure generated by the bubble generation, characterized in that the liquid discharge head is produced by the method comprises the steps of:

forming an electrically conductive layer consisting of an electrically conductive material on the top layer of the substrate, forming a spacer layer for making the void on the electrically conductive layer, forming a latent image layer consisting of an electrically conductive material on the spacer layer so that the latent image layer can have almost the same shape as the movable member, removing a portion of the spacer layer corresponding to the portion where the movable member is supported and fixed, so as to expose a part of the electrically conductive layer so as to form an aperture on the more upstream side of the liquid flow path, in terms of liquid flow direction, relative to the latent image layer, forming a metal plating layer constituting the movable member on the electrically conductive layer as well as on the latent image layer by electroplating using the electrically conductive layer as a cathode, and forming the movable member by removing the spacer layer.

According to the present invention, as described above, a structure having a supporting portion and a plate-like portion is formed of a plating film deposited and developed on an electrode and a latent image layer, wherein, since the plate-like portion of the micro structure is formed of the plating film deposited and developed on the latent image layer, and after forming a structure layer of the plating film, the entire spacer layer is removed, the size of the plate-like portion is defined by the size of the latent image layer. Accordingly, unlike the conventional methods in which a plate-like portion is formed by etching and removing a structure layer immediately under the member which is to become the plate-like portion, the length of the plate-like portion does not vary with the etching conditions. In addition, since the supporting portion of the micro structure is formed of a metal plating layer deposited and developed within the aperture provided on the spacer layer, the size of the supporting portion can be set independent of the thickness of the plate-like portion. As a result, if the size of the aperture portion is allowed to be larger relative to the thickness of the plate-like portion of a structure to be made, the stress concentration applied to the base of the plate-like portion will be relieved. The simplest structure made according to the present invention is, for example, a cantilever which is supported on a substrate by a supporting portion.

Further, a micro structure provided with an aperture in its plate-like portion can be also made by adding to the method a step of forming a second spacer layer at one site of the latent image layer to produce a structural layer, wherein a plating film is developed to a height with which it can surround the second spacer layer. In this case, if an opening is provided for the first spacer layer in the zone surrounding the latent image layer, a hollow micro structure having an opening provided on its top surface can be made. Still further, if another step is added to the above method at which one site of the substrate is removed from its bottom side so as to expose one site of the first spacer layer formed on the electrode, a nozzle structure can be made which is provided with a site removed from the substrate as a liquid supply opening and an opening on its top surface as an injection opening.

Further, if a plurality of latent image layers are formed leaving a space between each other, a plating film is deposited and developed on the layers in the order of increasing distance from the opening portion of the spacer layer. This provides a plate-like portion of which thickness changes in multiple different levels. Although the micro structure made still has a latent image layer on the back of the plate-like portion, the latent image can be removed after making a structural layer, if it is unnecessary.

The above spacer layer can be formed of high polymer resin. In this case, preferably oxygen plasma is used to remove the spacer layer, since it can easily peel the layer.

According to the present invention, on the spacer layer, a latent image layer is formed of an electrically conductive material in the shape of a movable member, and on the latent image layer, a metal plating layer which is to be the movable member is deposited and formed by electroplating. This allows to form a movable member with a high accuracy and high density, and consequently, to produce a liquid discharge head or the like which is stable in its discharge property in discharging liquid and highly reliable.

DETAILED DESCRIPTION OF THE PREFERRED EMBODIMENTS

Embodiments of the present invention will be described referring to drawings as below.

FIGS. 1A to 1E show sectional views of a micro structure in different steps of the process to illustrate one embodiment of the method of the present invention, employed for producing micro structures. Now, this embodiment will be described in further detail by way of example of the production process of a cantilever 10*a* supported by a support pillar 10*b* on a substrate 11, with reference to FIGS. 1A to 1E.

Figure 1A:
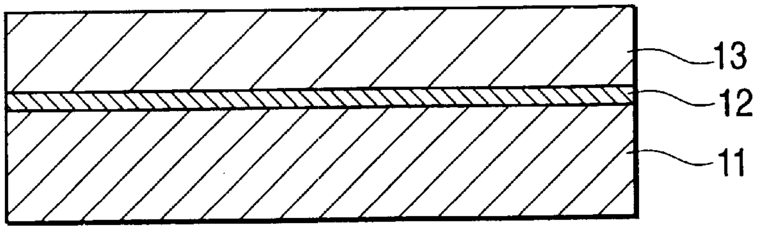
FIGS. 1A, 1B, 1C, 1D and 1E show sectional views of a micro structure in different steps of the process to illustrate one embodiment of the method of the present invention, employed for producing micro structures.

First, a spacer layer 13 comprising an insulating material is formed on a substrate 11 having an electrode 12 formed on its surface (FIG. 1A). A latent image layer 18 comprising an electrically conductive material is then formed on the surface of the spacer layer 13 at a predetermined zone (FIG. 1B), followed by providing an aperture 15 of a prescribed size in the spacer layer 13 at a position adjacent to the latent image layer 18 so as to expose the electrode 12 in the aperture 15. The latent image layer 18 is electrically insulated from the electrode 12. Then the electrode 12 as a cathode is electroplated to allow metal plating to be deposited on the surface of the electrode 12 exposed within the aperture 15. With its development, the metal plating deposited on the surface of the electrode 12 becomes closer to the latent image layer 18, and is deposited thereon just like on the electrode 12 to form a metal plating layer 17 having a hook-shaped section (FIG. 1D). Finally, after removing the spacer layer 13, a cantilever lOa is produced which consists of a metal plating layer 17.

As compared with the method described with reference to FIGS. 5A to 5E, according to this embodiment of the method of the present invention, the size of the cantilever 10*a* is determined by the size of the latent image layer 18 on the surface of the spacer layer 13; therefore the cantilever lOa does not undergo a change in length due to, for example, a side etching.

Also, as compared with the method described with reference to FIGS. 6A to 6D, according to this embodiment, the size of the aperture 15 is allowed to be larger relative to the film thickness of the cantilever 10*a;* therefore, the cantilever 10*a* has no inflection portion as shown in FIGS. 6A to 6D, which makes possible a relief of the stress concentration applied to the base of the cantilever 10*a*. As a result, even if the cantilever 10*a* is subjected to displacement by external force, the strain arising at its base will be decreased, which will control the age-based deterioration of its mechanical strength as well as breaking caused by mechanical metal fatigue.

In addition, in the production of the cantilever 10*a* of the present invention, the size of the metal plating layer 17 is determined by the size of the latent image layer 18, while, in the conventional method, it is formed into a desired pattern by photolithography process and etching. With the conventional method in which a metal thin film is patterned by wet etching, if the film is relatively thick, it is usually difficult to achieve a desired accuracy because it gives rise to a side etching. On the other hand, if the like metal is allowed to be formed by metal plating, patterning is not needed, and a micro structure having a desired pattern can be obtained.

Further, the film formed by a thin-film formation process usually contains clusters of particles, and in the structure produced by the thin-film formation process as shown in FIGS. 6A to 6D, the film formed on the inflection portion of the spacer layer is highly affected by such clusters, and its strength tends to be deteriorated. On the other hand, in the structure produced by the method of the present invention, a support pillar 10*b* and a cantilever 10*a* are formed at a time by metal plating, therefore the structure is less affected by the clusters of particles.

Now, the characteristics of each of the foregoing layer will be described below.

The electrode 12 is used as a cathode in electroplating. Accordingly, its surface is kept electrically conductive.

Once having formed the structure layer (the metal plating layer 17 in this embodiment) which is to become a micro structure, the spacer layer 13 is removed in the last step of the method, and it becomes a void between the micro structure and the substrate 11. For the spacer layer 13, used is a material which does not corrode in the metal plating bath used for producing a micro structure and is highly electrically insulating. As a material, organic high polymer resins, oxide materials such as $Sio_2$, $TiO_2$, $Al_2O_3$ and MgO, nitride materials such as $Si_3N_4$ and TiN, carbide materials such as SiC, TiC and C can be utilized. When removing the spacer layer 13, as a material constituting the spacer layer 13, selected are the materials such that the ratio of their etching selection to the etching selection of the materials constituting the structure layer will be sufficiently high. Preferable is organic high polymer resins such that they can be diluted with an organic solvent and subjected to the spinner, dipping or spray film-formation method to form a film, since they can be easily peeled by oxygen plasma ashing. Photo resist formed of such a resin material and containing less impurities such as sodium ion, etc. is particularly preferable as a material for the spacer layer 13, and with the spacer layer 13 formed of such a material, Si substrate with a circuit integrated on it can be used as a substrate 11.

The metal plating is deposited and developed not only on the electrode 12, but on the latent image layer 18. Therefore, the surface of the latent image layer 18 is kept electrically conductive. Although the latent image layer 18 is electrically insulated from the electrode 12 via the spacer layer 13, once the metal portion deposited through the aperture 15 provided in the spacer layer 13 comes into contact with the latent image layer 18, the electrical potential of the latent image layer 18 becomes the same as that of the electrode 12; thus, a structure layer is formed on the latent image layer 18 by electroplating. Typically, the latent image layer 18 is formed on the spacer layer 13 by metal thin-film forming process, and is patterned into a desirable shape applying the photo lithography process and etching. For thin-film formation, already known techniques, for example, resistance heating depositing, sputter depositing, and electron beam depositing can be used. The latent image layer 18 may consist of a plurality of patterns electrically insulated from each other on the spacer layer 13.

The structure layer of the present invention is formed by electroplating, that is, by depositing metal ion in a metal plating bath on the electrode 12 and the latent image layer 18 on the spacer layer 13 through electrochemical reaction. The micro structure of the present invention can be formed not only of the metal plating bath used, but of metals deposited from various kinds of metal salts such as a single salt, double salt and complex salt. The metals used in plating include, for example, Ni, Au, Pt, Cr, Cu, Ag, Zn as a single metal, and Cu—Zn, Sn—Co, Ni—Fe, Zn—Ni as an alloy, and the other materials may be also used as long as electroplating can be performed with them. Dispersed metal plating in which dispersed particles such as $Al_2O_3$, $TiO_2$ and PTFE are added to a metal plating bath can be also used as a structure layer.

EXAMPLES

The method of producing a micro structure of the present invention will be described in detail in terms of its concrete embodiments.

Example 1

Example 1 of the present invention will be described with reference to FIGS. 1A to 1E.

As a substrate 11, a silicon wafer was used. On the substrate 11, a film of Cr was formed to 50 nm thickness by electron beam deposition and subsequently a film of Au was formed to 100 nm thickness in the same vacuum, so as to produce an electrode 12. The substrate 11 having the electrode 12 formed on its surface was then subjected to spin-application of the whole aromatic polyamide acid solution, followed by heat treatment, so as to form a spacer layer 13 comprising a polyimide film (FIG. 1A).

Figure 1B:
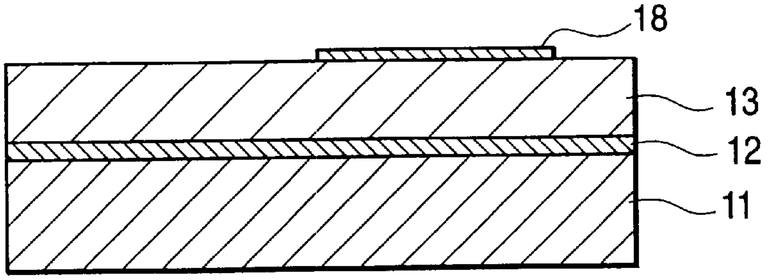

Then films of Cr and Au were formed on the spacer layer 13 in the same manner that the electrode 12 was formed, and said Cr and Au films were patterned by the photo lithography process and etching so as to form a latent image layer 18 (FIG. 1B). Au and Cr were etched using a mixed aqueous solution of iodine and potassium iodide and a mixed aqueous solution of diammonium cerium(IV) nitrate and perchloric acid, respectively.

Figure 1C:
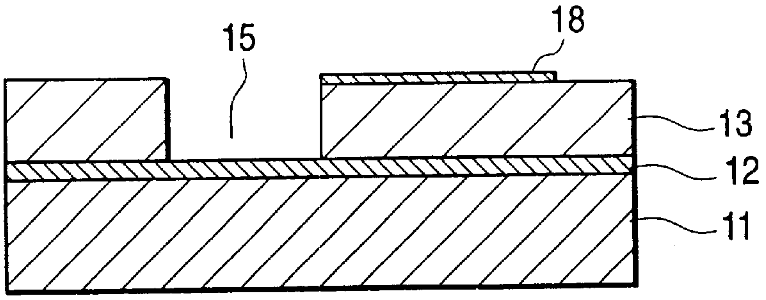
Figure 1D:
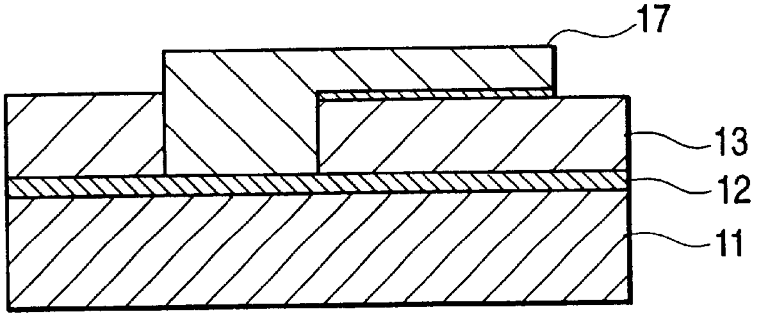

A part of the spacer layer 13 was then removed by the photo lithography process and reactive ion etching with oxygen to provide an aperture 15 in the neighborhood of the latent image layer 18, so as to expose a part of the electrode 12 under the spacer layer 13 (FIG. 1C).

Then Ni plating was performed using the electrode 12 as a cathode in Ni plating bath consisting of nickel sulfate, nickel chloride and boric acid at a bath temperature of 50° C. and a cathode current density of 5 $A/dm^2$. The deposition and development of Ni plating first occurred in the aperture 15, and once said Ni plating reached the latent image layer 18, the latent image layer 18 began to be plated, and finally a metal plating layer 17 was formed as shown in FIG. 1D.

Figure 1E:
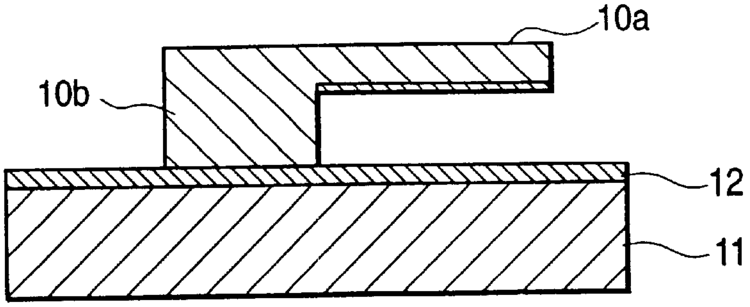

Lastly, the spacer layer 13 was removed by oxygen plasma etching using ECR, and produced was a cantilever 10*a* supported by a support pillar 10*b* as shown in FIG. 1E.

Example 2

Example 2 of the present invention will be described with reference to FIGS. 2A to 2D and 3E to 3G where a nozzle consisting of a liquid supply opening 20*c*, a passage 20*a* and an orifice 20*b* is shown as a micro structure.

Figure 2A:
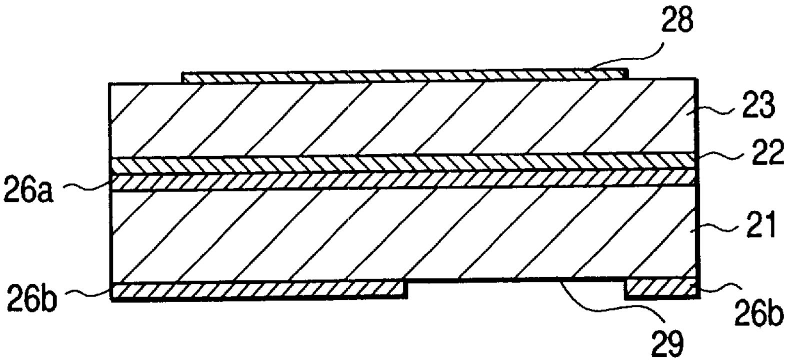
FIGS. 2A, 2B, 2C and 2D illustrate the process by steps of producing a nozzle according to the method of the present invention, employed for producing micro structures.

As a substrate 21, used was a n-type silicon wafer of which crystal orientation plane was (1 0 0). On both sides of the substrate 21, 1 μm thick silicon dioxide ($SiO_2$) films 26*a* and 26*b* were formed, respectively, through thermal oxidation of the substrate using oxidizing gas. Then a part of the silicon dioxide film 26*b* on the back side of the substrate 21 was removed to expose the substrate 21 so as to provide a window 29 for etching. On the other hand, on the silicon dioxide film 26*a* on the front side of the substrate 21, a Ti film of 10 nm thickness was formed by sputtering and subsequently a Pt film of 100 nm thickness was formed in the same vacuum, so as to form a electrode 22. The substrate 21 having the electrode 22 formed on it was then subjected to spin-application of a photoresist for semiconductor, AZ4620, from Hechst so as to form a first spacer layer 23. Then a 10 nm thick film of Cr was formed on the first spacer layer 23 by electron beam deposition and subsequently a 100 nm thick film of Au was formed in the same vacuum, after which said Cr and Au films were patterned by the photo lithography process and etching, so as to form a latent image layer 28 on the middle layer of the substrate 21 (FIG. 2A). Au and Cr were etched using a mixed aqueous solution of iodine and potassium iodide and a mixed aqueous solution of diammonium cerium(IV) nitrate and perchloric acid, respectively.

Figure 2B:
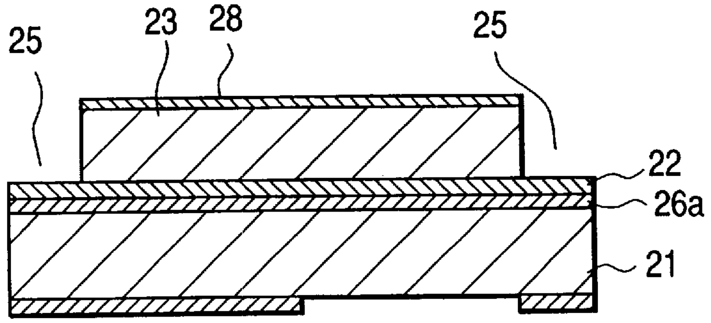

Then the first spacer layer 23 was patterned by reactive ion etching with oxygen using the latent image layer 28 as an etching mask to expose a part of the electrode 22, so as to provide an aperture 25 (FIG. 2B).

Figure 2C:
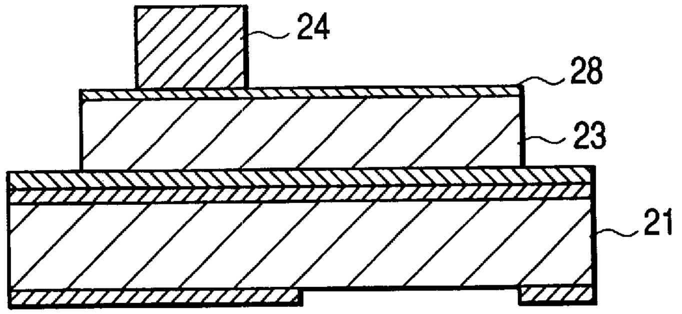

Then, using the same process as was used for forming the first spacer layer 23, the latent image layer 28 was subjected to spin-application of a photoresist AZ4620, and the photoresist was exposed to light and developed by the photo lithography process so as to form a second spacer layer 24 on the latent image layer 28. The second spacer layer 24 covers a part of the latent image layer 28 (FIG. 2C).

Figure 2D:
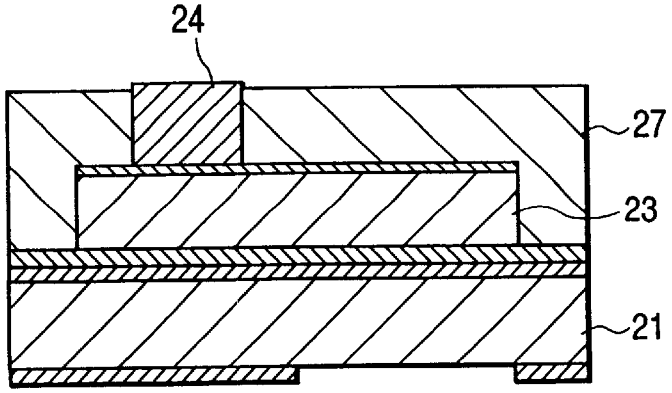

Then Ni plating was performed using the electrode 22 as a cathode in Ni plating bath consisting of nickel sulfate, nickel chloride and boric acid at a bath temperature of 50° C. and a cathode electric current density of 5 A/$dm^2$. The deposition and development of Ni plating first occurred in the aperture 25, and once said Ni plating reached the latent image layer 28, it began to deposit and develop on the latent image layer 28 surrounding the second spacer layer 24, and finally a metal plating layer 27 was formed (FIG. 2D).

Here, particularly noteworthy is that the plating was developed in such a manner that it offsets the irregularity generated by the first and the second spacer layers 23 and 24 on the substrate 21 and allowed the surface of the metal plating layer 27 to become almost level. The metal plating layer 27 finally becomes an aperture surface of a nozzle 20*b*, as described bellow. Thus, allowing the aperture surface of the nozzle 20*b* to be level makes easier its surface treatment such as water repellent finishing, etc.

Figure 3E:
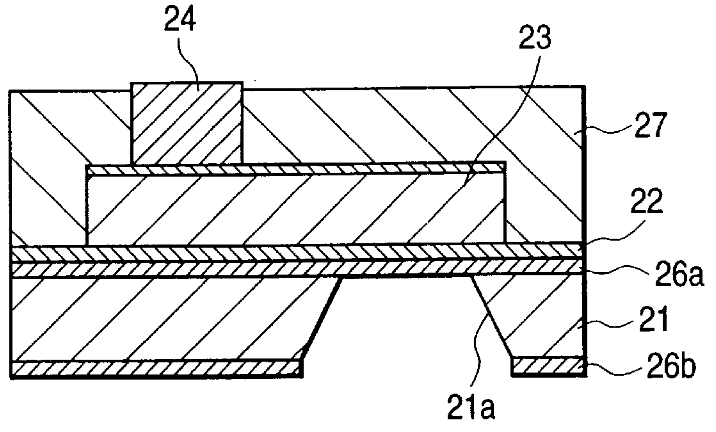
FIGS. 3E, 3F and 3G illustrate the process by steps of producing a nozzle according to the method of the present invention, employed for producing micro structures.

Then, the back side of the substrate 21 was subjected to crystal axis anisotropic etching with 22% TMAH (Tetramethylammoniumhydroxide) aqueous solution at 80° C. through the window 29, and a recessed portion 21*a* surrounded by the crystal surfaces of (1 1 1) was formed on the substrate 21 (FIG. 3E). The recessed portion 21*a* provided on the substrate 21 became a liquid supply opening 20c of the nozzle in the last step of the this method.

Figure 3F:
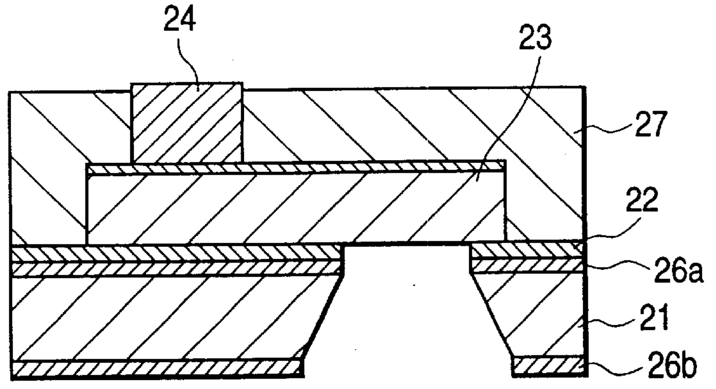

Further, the site of the silicon dioxide film 26*b* and the electrode 22 exposed through the recessed portion 21*a* was etched from the back side of the substrate 21 so as to expose a part of the first spacer layer 23 (FIG. 3F). The silicon dioxide film 26*b* was removed using BHF (buffered hydrofluoric acid) and Ti and Pt removed by milling using Ar.

Figure 3G:
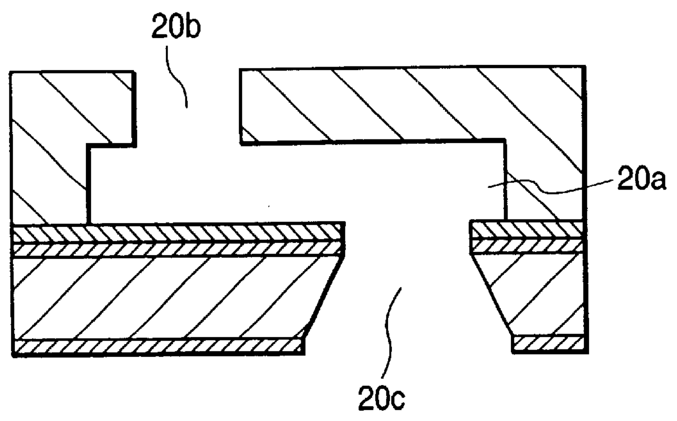

After that, the first and second spacer layers 23, 24 were etched and removed using acetone, and for the latent image layer 28, Au and Cr were etched and removed using a mixed aqueous solution of iodine and potassium iodide and a mixed aqueous solution of diammonium cerium(IV) nitrate and perchloric acid, respectively. As a result, produced was a nozzle having a liquid supply opening 20*c*, a passage 20*a* and an orifice 20*b* in which liquid supplied from the liquid supply opening 20*c* was jetted from the orifice 20*b* through the passage 20*a*, as shown in FIGS. 3E to 3G. The shape of the passage 20a and that of the orifice 20*b* are determined by the pattern of the first spacer layer 23 and that of the second spacer layer 24, respectively.

Example 3

In Example 3, a cantilever consisting of a film with two different thicknesses was produced using the method of producing a micro structure according to the present invention. Now Example 3 of the present invention will be described with reference to FIGS. 4A to 4E.

Figure 4A:
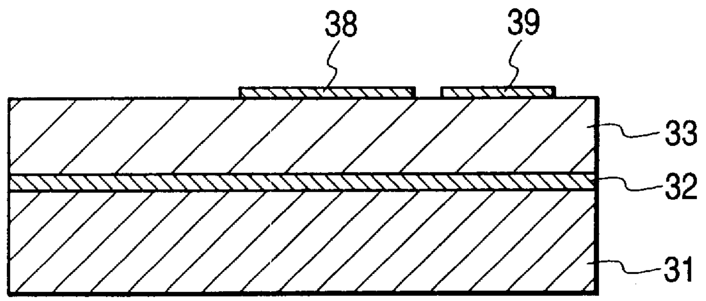
FIGS. 4A, 4B, 4C, 4D and 4E illustrate the process by steps of producing a cantilever, of which thickness changes in multiple different levels, according to the method of the present invention, employed for producing micro structures.

As a substrate 31, a glass substrate was used. On the substrate 31, a film of Cr was formed to 50 nm thickness by electron beam deposition and subsequently a film of Au was formed to 100 nm thickness in the same vacuum, so as to produce an electrode 32. The substrate 31 having the electrode 32 formed on its surface was then subjected to spin-application of the whole aromatic polyamide acid solution, followed by heat treatment, so as to form a spacer layer 33 comprising a polyimide film. Then films of Cr and Au were formed on the spacer layer 33 in the same manner that the electrode 32 was formed, and said Cr and Au films were patterned by the photo lithography process and etching so as to form a first and a second latent image layers 38, 39 arranged longitudinally along the cantilever 30*a* to be produced (FIG. 4A). In patterning the first and second latent image layers 38, 39, Au and Cr were etched using a mixed aqueous solution of iodine and potassium iodide and a mixed aqueous solution of diammonium cerium(IV) nitrate and perchloric acid, respectively.

Figure 4B:
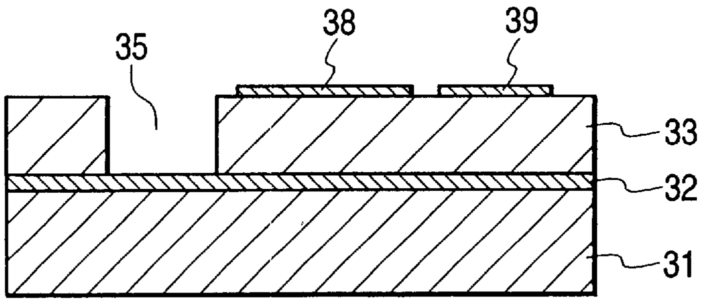

A part of the spacer layer 33 was then removed by the photo lithography process and reactive ion etching with oxygen to provide an aperture 35 in the neighborhood of the first latent image layer 38, so as to expose a part of the electrode 32 under the spacer layer 33 (FIG. 4B).

Figure 4C:
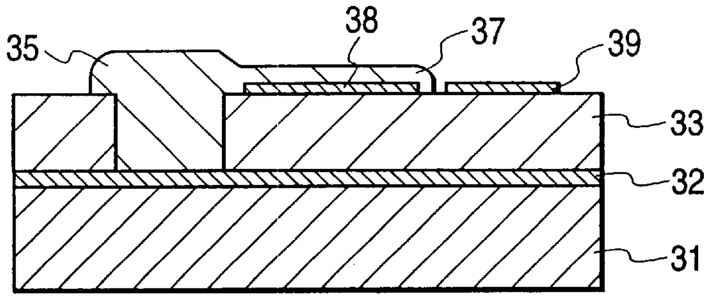
Figure 4D:
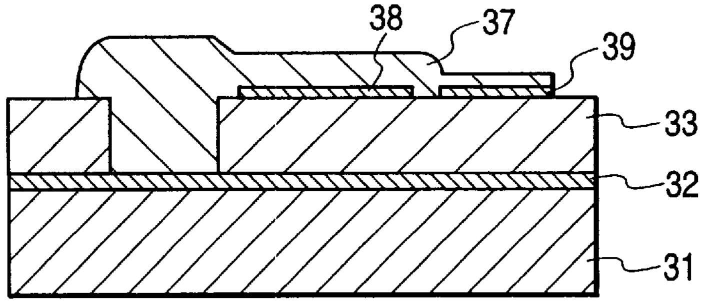
Figure 4E:
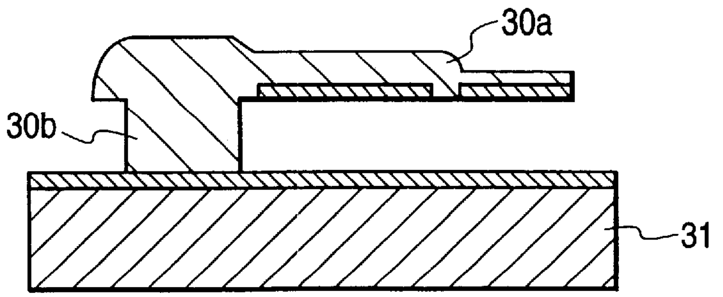
Figure 5A:
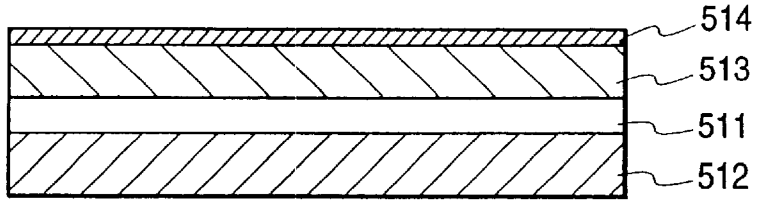
FIG. 5A PRIOR ART
FIGS. 5A, 5B, 5C, 5D and 5E illustrate one example of the process by steps of producing a micro structure according to the method of the prior art.
Figure 5B:
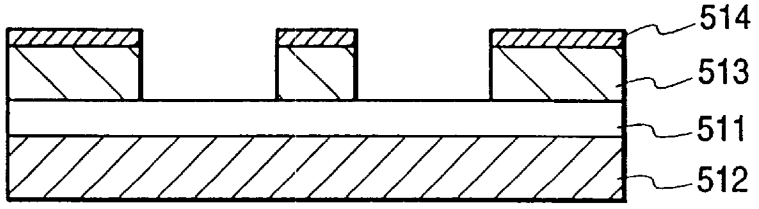
FIG. 5B PRIOR ART
Figure 5C:
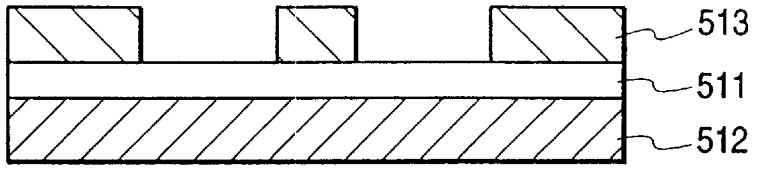
FIG. 5C PRIOR ART
Figure 5D:
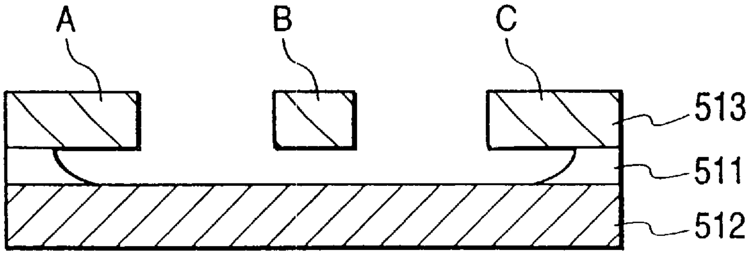
FIG. 5D PRIOR ART
Figure 5E:
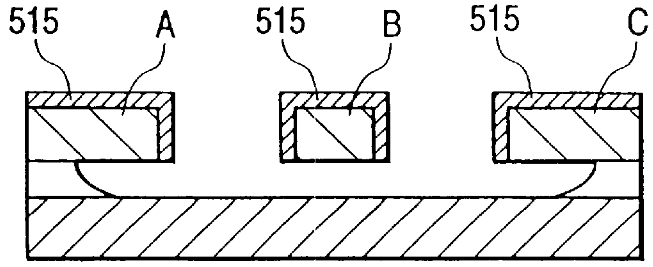
FIG. 5E PRIOR ART
Figure 6A:
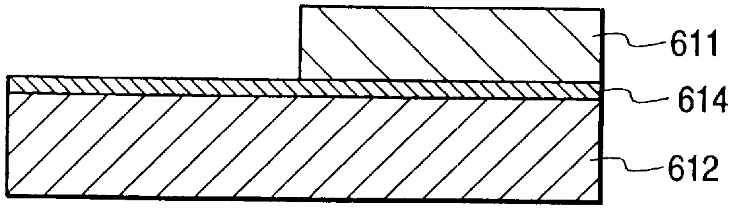
FIG. 6A PRIOR ART
FIGS. 6A, 6B, 6C and 6D illustrate another example of the process by steps of producing a micro structure according to the method of the prior art.
Figure 6B:
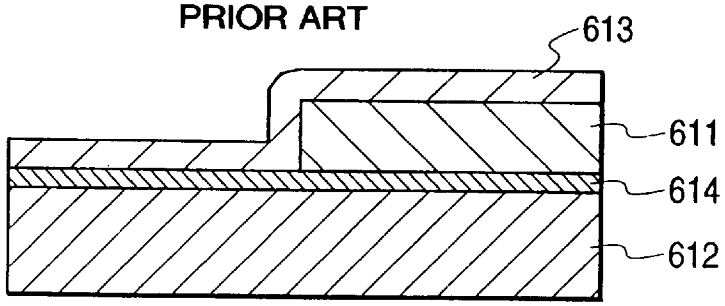
FIG. 6B PRIOR ART
Figure 6C:
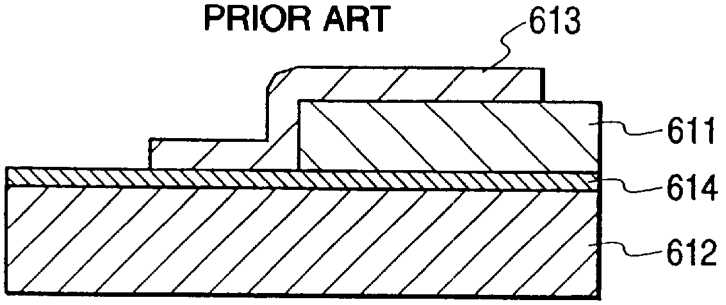
FIG. 6C PRIOR ART
Figure 6D:
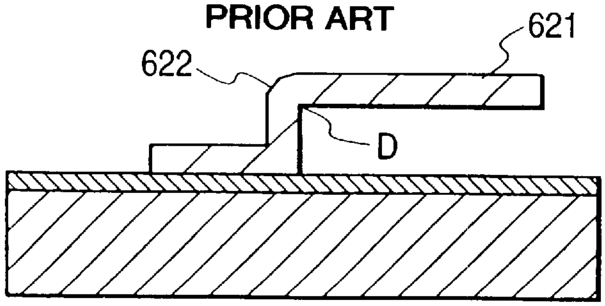
FIG. 6D PRIOR ART

Then Ni plating was performed using the electrode 32 as a cathode in Ni plating bath consisting of nickel sulfate, nickel chloride and boric acid at a bath temperature of 50° C. and a cathode current density of 5 A/$dm^2$. The Ni plating was first deposited and developed in the aperture 35, and after the aperture 35 was completely plated, it began to develop on the surface of the spacer layer 33 spreading laterally. Once said Ni plating reached the first latent image layer 38, the latent image layer 38 began to be plated, and finally a metal plating layer 37 was formed (FIG. 4C). Further continuing this plating, the plating layer was developed in the direction of the thickness of the substrate 31, while spreading on the surface of the spacer layer 33, and once the Ni plating reached the second latent image layer 39, the metal plating layer was formed on the second latent image layer 39 (FIG. 4D).

Lastly, the spacer layer 33 was removed by oxygen plasma etching using ECR, and produced was a cantilever 30*a* which was supported via a support pillar 30*b* on the substrate 31 and of which thickness was reduced halfway to its end.

While, in Example 3, a cantilever consisting of a film with two different thicknesses was produced using two latent image layers, it goes without saying that use of an increased number of latent image layers makes it possible to produce a micro structure consisting of a film with an increased number of thickness.

Example 4

Now Example 4 of the present invention in which a liquid discharge head was produced as a micro structure will be described with reference to the attached drawings.

Figure 7:
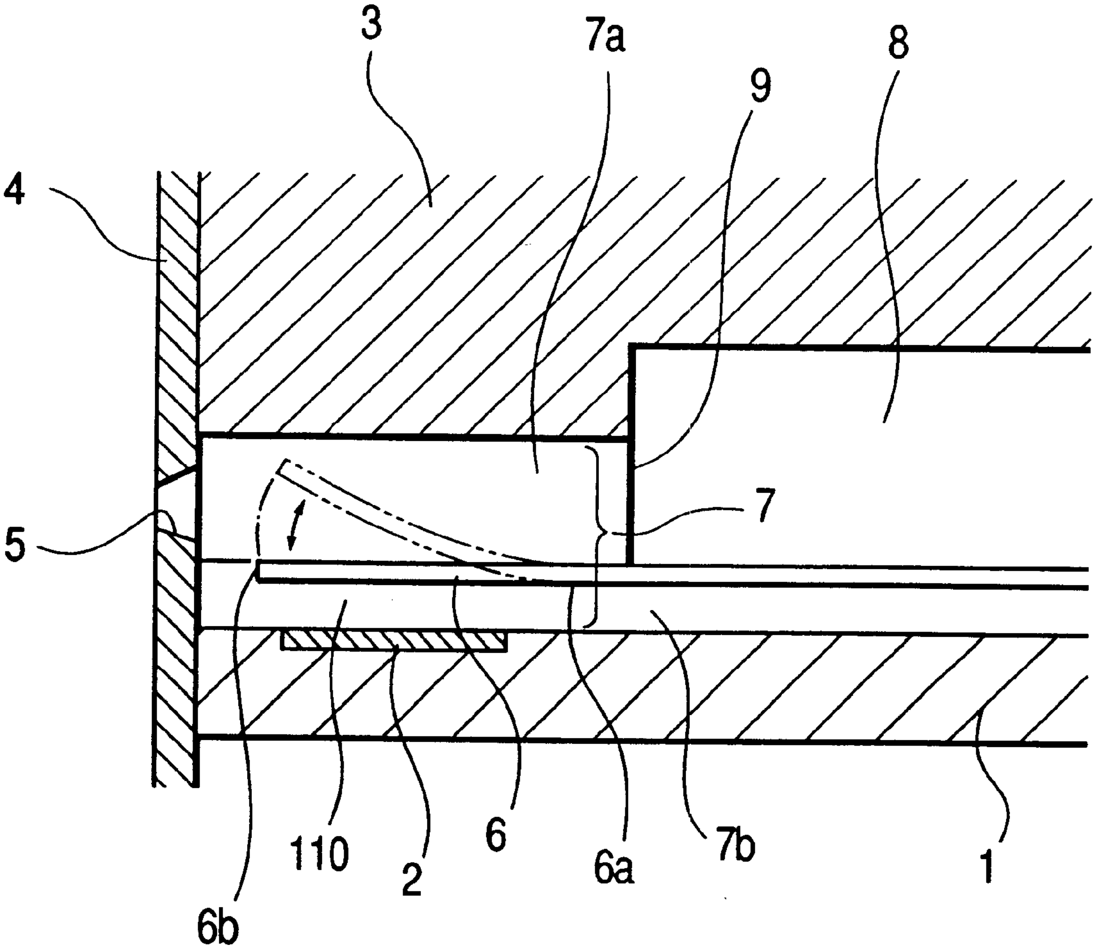
FIG. 7 is a sectional view of the liquid discharge head according to the example 4 of the present invention, taken along the liquid flow path direction to illustrate the basic construction of one embodiment of the method of the present invention for producing thereof.
Figure 8:
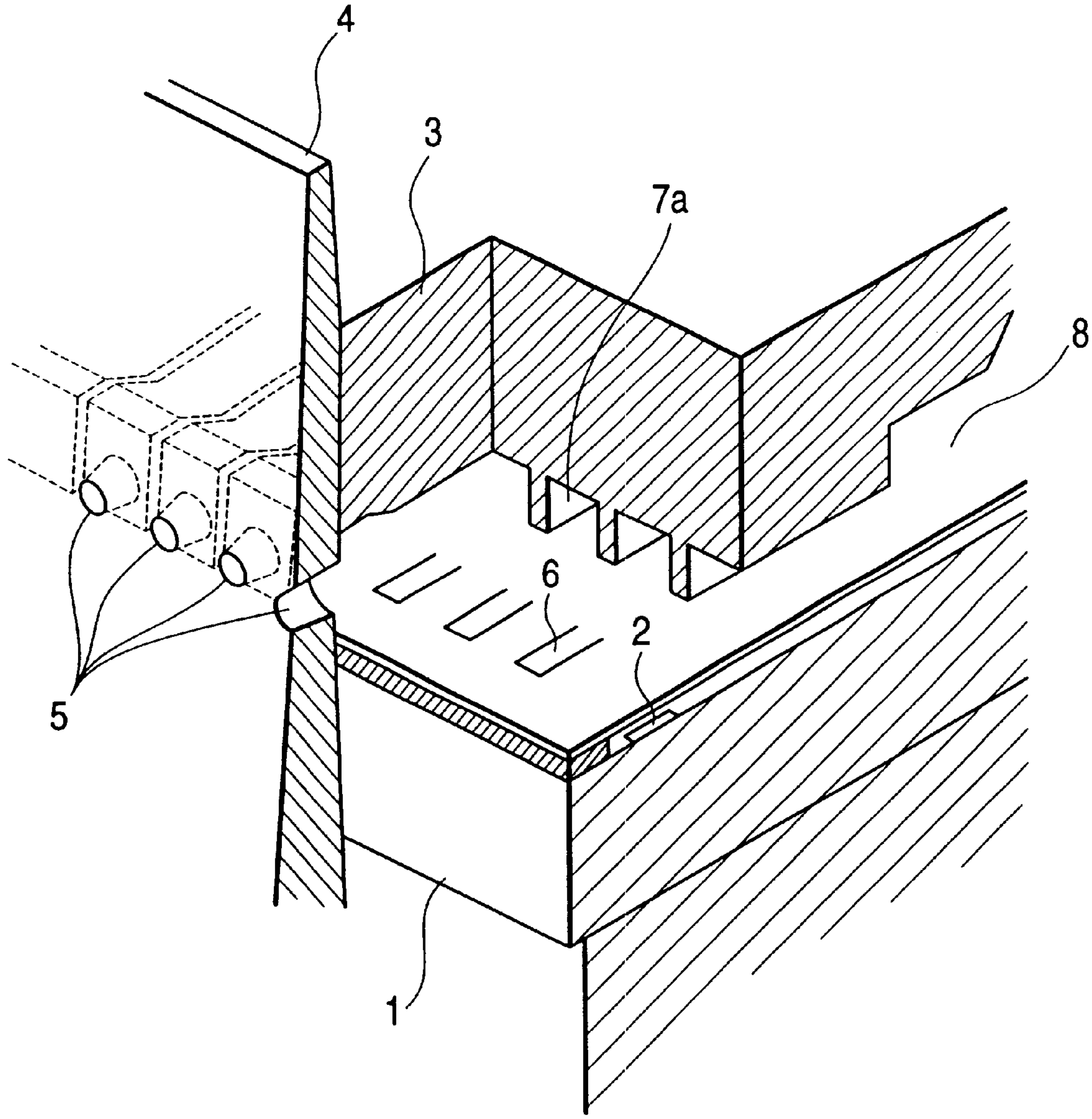
FIG. 8 is a partially cutaway view in perspective of the liquid discharge head shown in FIG. 7.

FIG. 7 is a sectional view of the liquid discharge head according to one embodiment of the present invention, taken along the liquid flow path direction to illustrate the basic construction thereof, and FIG. 8 is a partially cutaway view in perspective of the liquid discharge head shown in FIG. 7.

As shown in FIG. 7, this liquid discharge head has an elemental substrate 1 provided with a plurality of (in FIG. 7, only one) heating elements 2 in parallel to give a liquid heat energy for generating bubbles, a top board 3 joined to the elemental substrate 1, and an orifice plate 4 joined to both of the front end surfaces of the elemental substrate 1 and the top board 3.

The elemental substrate 1 is such that a silicon oxide film or a silicon nitride film for insulation and heat accumulation is formed on the substrate of silicon, etc., and an electric resistance layer constituting the heating elements 2 and a wiring electrode are patterned thereon. The heating elements 2 generate heat when voltage is applied to the electric resistance layer from the wiring electrode to allow a current to pass through the electric resistance layer.

The top board 3 is provided in order to constitute a plurality of liquid flow paths 7 corresponding to each heating element 2 and a common liquid chamber 8 for supplying a liquid to each liquid flow path 7, and it is integrally provided with a passage sidewall 9 extending from its ceiling portion to between the heating elements 2. The top board 3 consists of silicon series materials, on which patterns of the liquid flow paths 7 and the common liquid chamber 8 can be formed by etching or, after depositing materials such as silicon nitride and silicon oxide used for passage sidewall 9 on the silicon substrate by a known film-forming process such as CVD, the portion of the liquid flow paths 7 can be formed by etching.

On the orifice plate 4, formed are a plurality of discharge ports 5 (refer to FIG. 8) which are corresponding to each liquid flow path 7 and in communication with the common liquid chamber 8 therethrough. The orifice plate 4 also consists of a silicon-based material, and it is formed by, for example, planing the silicon substrate, on which the discharge ports 5 have been formed, to about 10 to 150 μm thickness. The orifice plate 4 is not always necessary for the present invention, and the top board 3 can be used instead of the orifice plate 4 in such a manner that, when forming liquid flow paths 7 on the top board 3, a wall whose thickness corresponds to that of the orifice plate 4 is left on the end surface of the top board 3, and discharge ports 5 are formed on the portion to give a top board with discharge ports.

The liquid discharge head is also provided with a cantilever-like movable member 6 disposed opposite to the heating elements 2 so that it will divide the liquid flow path 7 into a first liquid flow path 7*a* in communication with the discharge ports 5 and a second liquid flow path 7*b* having the heating elements 2. The movable member 6 is a thin film formed of silicon-based materials such as silicon nitride and silicon oxide, or of nickel or the like excellent in elasticity.

This movable member 6 has a supporting point 6*a* on the upstream side of a big liquid stream, which flows from the common liquid chamber 8, above the movable member 6, to the discharge ports 5, generated by the discharge motion of the liquid, in the neighborhood of the portion where it is supported by and fixed to the elemental substrate 1. And the movable member 6 is disposed at the position facing the heating elements 2 at a given distance therefrom in such a manner that it has a free end 6*b* on the downstream side relative to the supporting point 6*a* and it covers the heating elements 2. The space between the heating elements 2 and the movable member 6 becomes a bubble generating area 110.

When the heating elements 2 is allowed to generate heat, on the basis of the above construction, the heat generated affects the liquid in the bubble generating area 110 between the movable member 6 and the heating elements 2, which leads to a film boiling phenomenon and consequently causes bubbles to generate and grow on the heating elements 2. A pressure accompanying the growth of the bubbles acts over the movable member 6 in preference to the others, and the free end 6*b* of the movable member 6 undergoes displacement in such a manner that it widely opens toward the discharge port 5 around the supporting point 6*a* as shown with the dashed line in FIGS. 1A to 1E. The displacement of the movable member 6 or the state in which the movable member 6 has undergone displacement directs the propagation of the pressure caused by bubble generation and the growth of bubbles themselves toward the discharge port 5, and consequently the liquid is discharged from the discharge port 5.

In other words, providing a movable member 6, having a supporting point 6a on the upstream side (the common liquid chamber 8 side) of the liquid flow in the liquid flow path 7 and a free end 6b on the downstream side (the discharge port side), in the bubble generating area 110 allows to direct the propagation of bubble pressure toward the downstream side, which in turn makes the bubble pressure to contribute directly and efficiently to the discharge of liquid. And like the propagation of bubble pressure, the growth of bubbles itself is also directed toward the downstream side, that is, bubbles grow more highly in the downstream than in the upstream. Thus, controlling the growth of bubbles itself as well as the propagation direction of bubble pressure by the movable member 6 makes possible improvement in the fundamental discharge properties such as discharge efficiency, discharge force, or discharge speed etc.

The terms "upstream" and "downstream" used herein refer to the direction in terms of a liquid flow from a liquid supply, above the bubble generating area 110 (or the movable member 6), toward the discharge port 5, and the direction in connection with the construction of the structure.

On the other hand, in the step of stopping the bubble formation, bubbles rapidly disappear due to the synergistic effect of the elasticity of the movable member 6, and finally the movable member 6 is reset at its initial position as shown with the solid line in FIG. 7. At this time, the liquid flow path 7 is refilled with the liquid flowing from the upstream side, that is, the common liquid chamber 8, so that the liquid will compensate shrinkage of the volume of bubbles in the bubble generating area 110, as well as reduction of the volume of liquid due to the above liquid discharge, and this refill is performed efficiently, rationally and stably with the reset action of the movable member 6.

Figure 9:
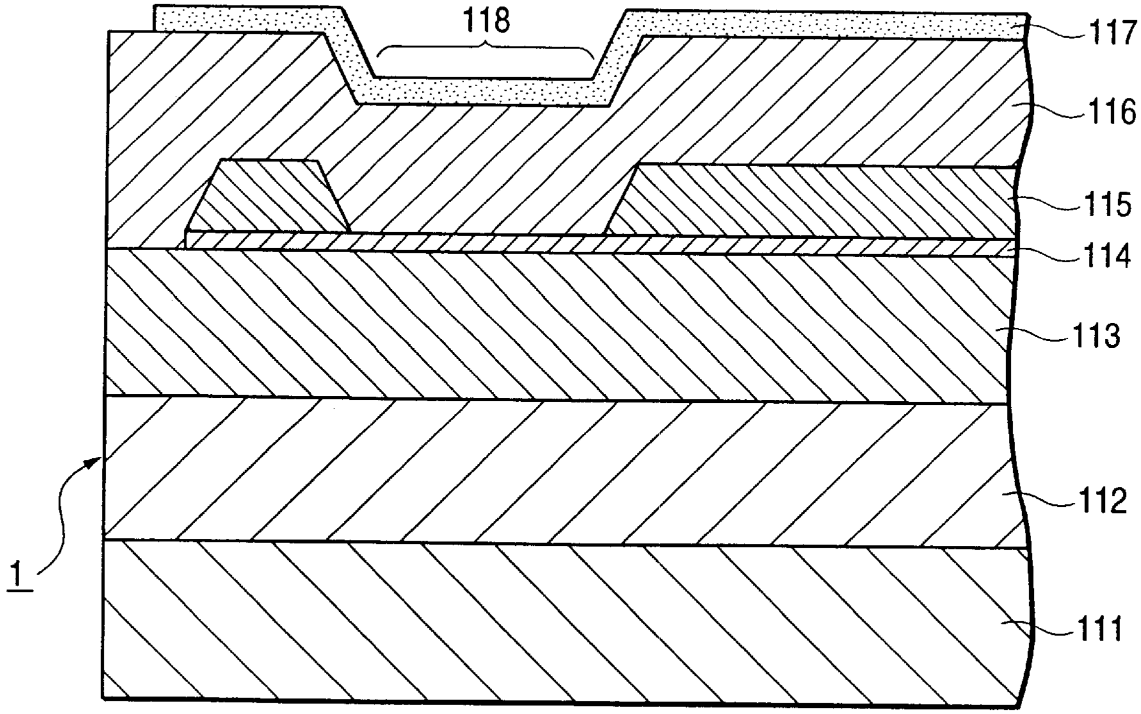
FIG. 9 is sectional view showing the elemental substrate, in the neighborhood of a heating element, of the liquid discharge head shown in FIG. 7.

Now the elemental substrate 1 of the liquid discharge head shown in FIG. 7 will be described. FIG. 9 is a partially cutaway view in section showing the elemental substrate, in the neighborhood of a heating element, of the liquid discharge head shown in FIG. 7.

In FIG. 9, the reference numerals 111 and 112 indicate a silicon substrate and a thermally oxidized film which is a heat accumulating layer, respectively. The reference numeral 113 indicates a $SiO_2$ or $Si_3N_4$ film which is an interlayer film also serving as a heat accumulating layer, the reference numeral 114 a resistance layer, the reference numeral 115 an Al alloy wiring of, for example, Al, Al—Si, Al—Cu, etc., and the reference numeral 116 a $SiO_2$ or $Si_3N_4$ film which is a protective film. The reference numeral 117 indicates a cavitation resistant film for protecting the protective film 116 from physical and chemical impacts caused by heat generation of the resistance layer 114. Lastly, the reference numeral 118 indicates a heat applying portion of the resistance layer 114 in the zone where the wiring 115 is not formed.

These driving elements are formed on the Si substrate using semiconductor technologies, and the heat applying portion is also formed on the same substrate.

Figure 10:
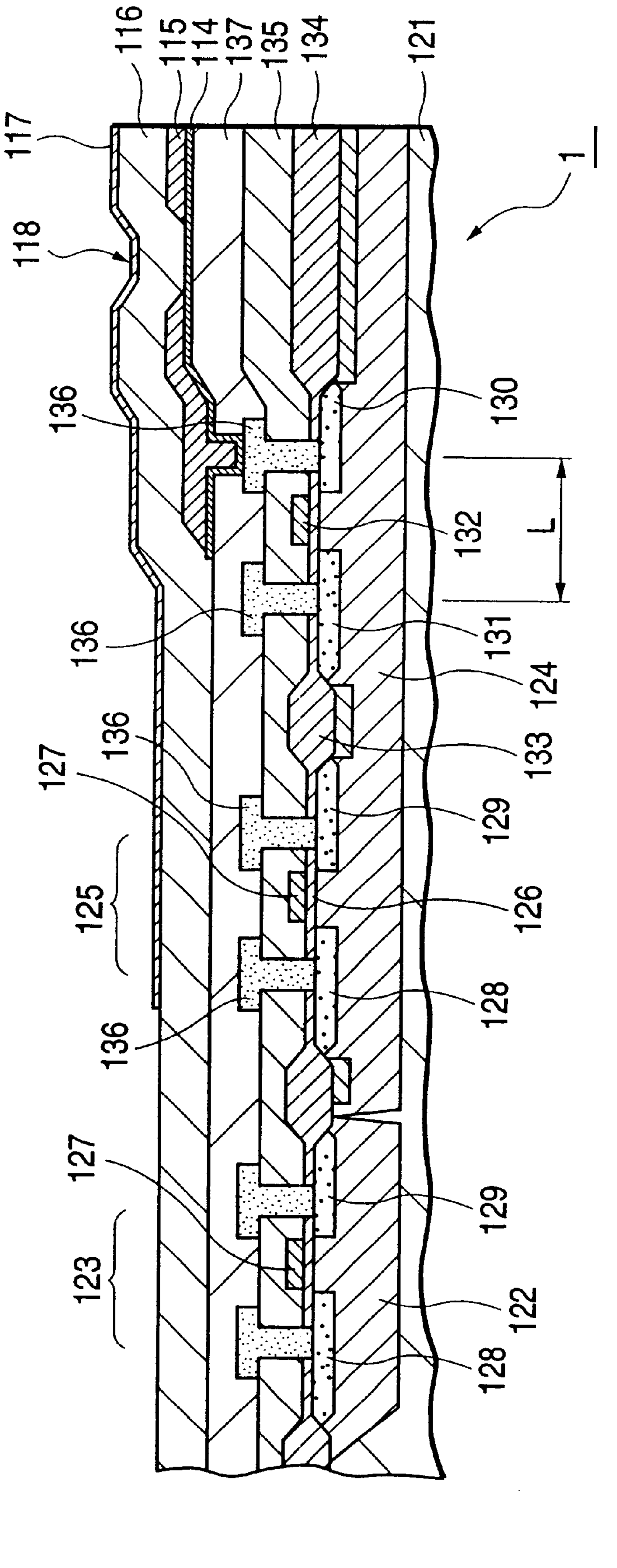
FIG. 10 is a vertically cutaway schematic view in section showing each of the main elements of the elemental substrate.

FIG. 10 is a vertically cutaway schematic view in section showing each of the main elements of the elemental substrate.

A Si substrate 121 which is a P-conductor consists of P-MOS 123 and N-MOS 125 constructed in a N-type well area 122 and in a P-type well area 124, respectively, by a process of introducing and diffusing impurities, such as ion implantation method which is a common MOS process. Each of P-MOS 123 and N-MOS 125 consists of a gate wiring 127 of poly-Si deposited to a thickness within the range of 4000 Å to 5000 Å by CVD method via a gate insulation film 126 with thickness several hundreds Å, a source area 128 into which p-type impurities are introduced, and a drain area 129. And C-MOS logic consists of the P-MOS 123 and N-MOS 125.

And a N-MOS transistor for driving elements consists of a drain area 130, a source area 131, and a gate wiring 132 which are constructed in a p-well substrate also by a process of, for example, introducing and diffusing impurities.

While this embodiment is described in terms of a construction using a N-MOS transistor, the transistor to be used is not limited to this, as long as it is capable of driving a plurality of heating elements separately and has a function of achieving a micro structure as described above.

Each element is separated from each other by an oxide separation area 133 formed to a thickness within the range of 5000 Å to 10000 Å by a process of field oxidation. The field oxidation film serves as a first heat accumulating layer 134 below the heat applying portion 118.

After forming each element, a layer-to-layer insulation film 135 is formed by depositing a PSG (Phospho-Silicate Glass) film, BPSG (Boron-doped Phospho-Silicate Glass) film or the like to a thickness of about 7000 Å by CVD method, then flattened by heat treatment, after which wiring is performed via a contact hole at an Al electrode 136 which is to be a first wiring layer. Then, a layer-to-layer insulation film 137 is formed by depositing a $SiO_2$ film or the like to a thickness within the range of 10000 Å to 15000 Å by plasma CVD method, and a $TaN_{0.8\ hex}$ film of about 1000 Å thickness, as a resistance layer 114, is formed by DC sputter method via a through hole. Then, formed is an Al electrode which is to be a second wiring layer for each heating element.

A protective film 116 is formed by depositing a $Si_3N_4$ film to a thickness of about 10000 Å by plasma CVD. And the top layer is an electrically conductive layer consisting of an electrically conductive material, that is, a cavitation resistant film 117 which functions as a cathode in metal plating, as described below, is formed by depositing, for example, Ta to a thickness of about 2800 Å.

Now, a method of producing a movable member which is a feature of the liquid discharge head of this embodiment will be described in more detail with reference to FIGS. 11A to 11E. FIGS. 11A to 11E illustrate sectional views of a movable member of the liquid discharge head shown in FIG. 7, which are in different steps of the production process.

Figure 11A:
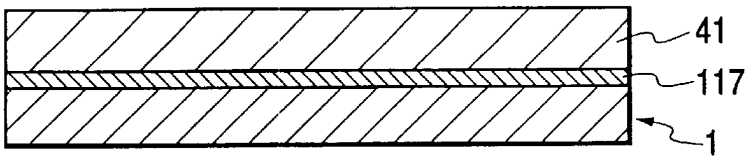
FIGS. 11A, 11B, 11C, 11D and 11E illustrate sectional views showing a producing method of a movable member of the liquid discharge head shown in FIG. 7.

First, the cavitation resistant film 117 of the elemental substrate 1 was subjected to spin-application of the whole aromatic polyamide solution, followed by heat treatment, so as to form a spacer layer 41 comprising a polyimide thinfilm, as shown in FIG. 11A. For the spacer layer 41, used were materials which do not corrode in a metal plating bath and are highly insulating. As a material, organic high polymer resins, oxide materials such as $SiO_2$, $TiO_2$, $Al_2O_3$ and MgO, nitride materials such as $Si_3N_4$ and TiN, carbide materials such as SiC, TiC and C can be utilized.

Figure 11B:
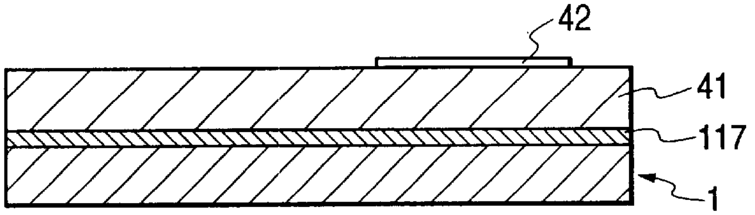

Then, a film of Cr was formed to 50 nm thickness in vacuum by electron beam deposition and subsequently a film of Au was formed to 100 nm thickness in the same vacuum, after that the film was patterned by the photo lithography process and etching, so as to form a latent image layer 42 consisting of an electrically conductive material on the spacer layer 41 (Refer to FIG. 11B). The Au and Cr were etched using a mixed aqueous solution of iodine and potassium iodide and a mixed aqueous solution of diammonium cerium(IV) nitrate and perchloric acid, respectively. As a result, the latent image layer 42 was patterned into almost the same shape as the movable member 6.

Figure 11C:
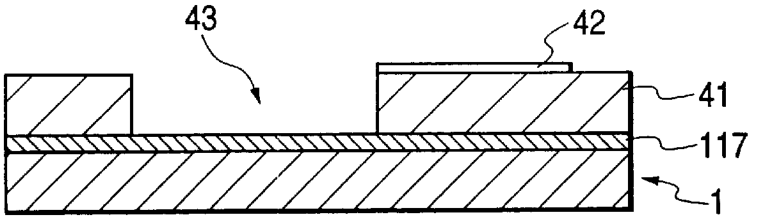
Figure 11D:
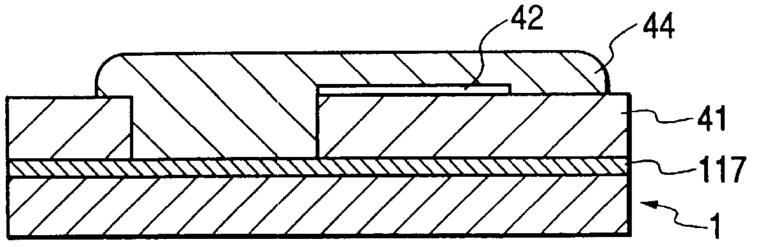

Then, a part of the spacer layer 41 corresponding to the portion supporting and fixing the movable member 6 was removed by the photo lithography process and reactive ion etching by oxygen to provide an aperture 43 in the neighborhood of the latent image layer 42, so as to expose a part of the cavitation resistant film 117 under the spacer layer 41, as shown in FIG. 11C. This aperture 43 was formed on the upstream side of the liquid flow path 7 (Refer to FIG. 7), in terms of its liquid flow, in the liquid discharge head. When forming an etching mask on the spacer layer 41 in the photo lithography process, it was formed in such a manner that at least the portion of the spacer layer 41 above the aperture 43 corresponding to the portion supported by and fixed to the movable member 6 is left. And the portion of the spacer layer 41 which is to become the aperture 43 is removed by etching afterward. At this time, the latent image layer 42 functions as a part of an etching mask, which allows to perform registering between the latent image layer 42 and the aperture 43 with high accuracy.

Then Ni electroplating was performed using the cavitation resistant film 117 as a cathode in Ni plating bath consisting of nickel sulfate, nickel chloride and boric acid at a bath temperature of 50° C. and a cathode current density of 5 $A/cm^2$, so as to deposit and develop the metal plating in the aperture 43 on the cavitation resistant film 117. The metal plating deposited on the cavitation resistant film 117 was further developed to eventually come into contact with the latent image layer 42, and once the cavitation resistant film 117 and the latent image layer 42 became electrically connected, the metal plating was deposited on the latent image layer 42 as well, and a metal plating layer 44 was formed (Refer to FIG. 11D).

Figure 11E:
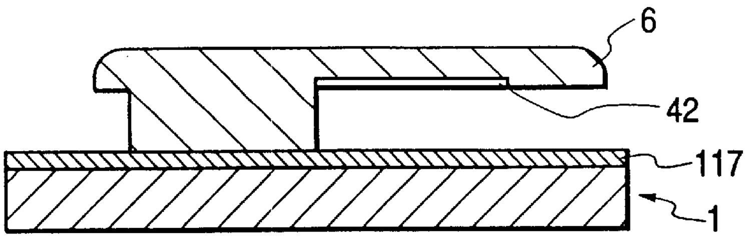

Lastly, the spacer layer 41 was removed by oxygen plasma etching using ECR, and produced on the substrate 1 was a movable member 6 composed of the metal plating layer 44 (Refer to FIG. 11E).

As a material constituting the spacer layer 41, selected are the materials such that the ratio of their etching selection to the etching selection of the materials constituting the metal plating layer 44 (the movable member 6) will be sufficiently high. As a material constituting the spacer layer 41, preferable is organic high polymer resins such that they can be diluted with an organic solvent and subjected to the spinner, dipping or spray film-formation method so as to form a film, since they can be easily peeled by oxygen plasma ashing. Photo resist made of such a resin material and containing less impurities such as sodium ion, etc. is particularly preferable as a material for the spacer layer 41, and with the spacer layer 41 formed of such a material, the circuit formed on the elemental substrate 1 can be less affected.

The metal plating is developed not only on the cavitation resistant film 117 which is an electrically conductive layer, but on the latent image layer 42. Therefore, the surface of the latent image layer 42 is kept electrically conductive. Although the latent image layer 42 is electrically insulated from the electrically conductive layer (the cavitation resistant film 117) via the spacer layer 41, once the metal plating deposited in the aperture 43 provided on the spacer layer 41 comes into contact with the latent image layer 42, the electrical potential of the latent image layer 42 becomes the same as that of the cavitation resistant film 117; thus, a metal plating layer 44 is also formed on the latent image layer 42 by electroplating.

Typically, the latent image layer 42 is formed on the spacer layer 41 by metal thin-film formation method, and is patterned into a desirable shape (the shape of the movable member 6) by applying the photo lithography process and etching. For thin-film formation, already known techniques, for example, resistance heating deposition, spatter deposition, and electron beam deposition can be used. The latent image layer 42 may consist of a plurality of patterns electrically insulated from each other on the spacer layer 41.

The movable member 6 of the present invention is formed by electroplating, that is, by depositing metal ion in a metal plating bath on the electrically conductive layer (the cavitation resistant film 117) and the latent image layer 42 on the spacer layer 41 through electrochemical reaction. The movable member 6 of the present invention can be formed not only using metal plating bath, but also of metals deposited from various kinds of metal salts such as a single salt, double salt and complex salt. The main metals used in plating include, for example, Ni, Au, Pt, Cr, Cu, Ag, Zn as a single metal, and Cu—Zn, Sn—Co, Ni—Fe, Ni—Cr, Ni—Co, Zn—Ni as an alloy, and the other materials may be also used as long as electroplating can be performed with them. Dispersed metal plating in which dispersed particles such as $Al_2O_3$, $TiO_2$ and PTFE are added to a metal plating bath can be also used for the movable member 6 of the present invention.

As described above, according to the present invention, the movable member 6 is formed by, first, forming on the spacer layer 41 the latent image layer 42 consisting of an electrically conductive material patterned into almost the same shape of the movable member 6 and then metal plating the latent image layer 42; and therefore, the dimensions of the movable member 6 is determined by the dimensions of the latent image layer 42, which makes it possible to decrease the variations in the mechanical properties of the movable member 6 caused by the variations in the dimensions thereof. Thus the movable member 6 can be produced with a high accuracy and high density, and consequently, a liquid discharge head can be produced which is stable in its discharge properties in discharging liquid and is highly reliable.

Example 5

FIGS. 12A to 12E show sectional views of a movable member in the liquid discharge head shown in FIG. 7 to illustrate the Example 2 of the method of the present invention for producing thereof.

Figure 12A:
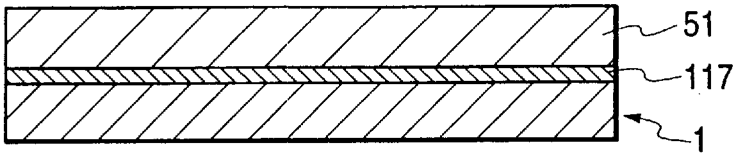
FIGS. 12A, 12B, 12C, 12D and 12E show sectional views of a movable member according to the example 5 of the present invention which is in the liquid discharge head shown in FIG. 7, to illustrate the second embodiment of the method of the present invention for producing thereof.

First, the cavitation resistant film 117 of the elemental substrate 1 was subjected to spin-application of the whole aromatic polyamide acid solution, followed by heat treatment, so as to form a spacer layer 51 consisting of a polyimide thin-film, as shown in FIG. 12A. For the spacer layer 51, used were materials which do not corrode in a metal plating bath and are highly insulating. As a material, organic high polymer resins, oxide materials such as $SiO_2$, $TiO_2$, $Al_2O_3$ and MgO, nitride materials such as $Si_3N_4$ and TiN, carbide materials such as SiC, TiC and C can be utilized.

Figure 12B:
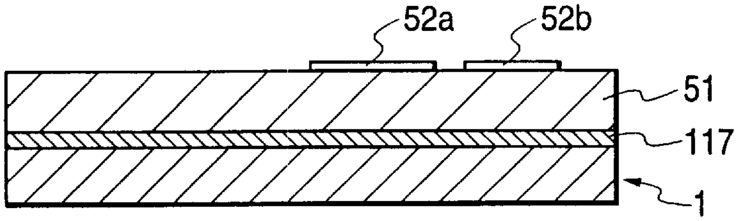

Then, a film of Cr was formed to 50 nm thickness in vacuum by electron beam deposition and subsequently a film of Au was formed to 100 nm thickness in the same vacuum, after that the film was patterned by the photo lithography process and etching, so as to form a first latent image layer 52*a* and a second latent image layer 52*b* consisting of an electrically conductive material on the spacer layer 51 (Refer to FIG. 12B). The Au and Cr were etched using a mixed aqueous solution of iodine and potassium iodide and a mixed aqueous solution of diammonium cerium(IV) nitrate and perchloric acid, respectively. As a result, the latent image layers 52*a* and 52*b* were patterned into almost the same shape as the movable member 6.

Figure 12C:
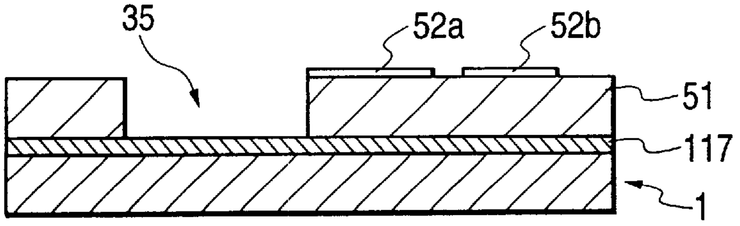
Figure 12D:
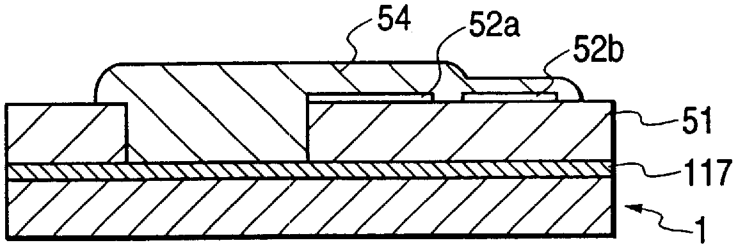

Then, a part of the spacer layer 51 corresponding to the portion supporting and fixing the movable member 55 was removed by the photo lithography process and reactive ion etching by oxygen to provide an aperture 53 in the neighborhood of the first latent image layer 52*a,* so as to expose a part of the cavitation resistant film 117 under the spacer layer 51, as shown in FIG. 12C. This aperture 53 was formed on the upstream side of the liquid flow path 7 (Refer to FIG. 7), in terms of its liquid flow, in the liquid discharge head.

Then Ni electroplating was performed using the cavitation resistant film 117 as a cathode in Ni plating bath consisting of nickel sulfate, nickel chloride and boric acid at a bath temperature of 50° C. and a cathode current density of 5 $A/cm^2$. The Ni plating was first deposited in the aperture 53, and after the aperture 53 was completely plated, it was developed spreading isotropically on and above the spacer layer 51. Once the Ni plating reached the first latent image layer 52*a,* a metal plating layer 54 was formed thereon. After continuing the plating, the plating began to spread on the spacer layer 51, and once the Ni plating reached the second latent image layer 52*b,* the metal plating layer 54 was also formed thereon (Refer to FIG. 12D). For the metal plating layer 54 formed as described above, it has two different levels of thickness, one on the first latent image layer 52*a* and the other on the second latent image layer 53*b.*

Figure 12E:
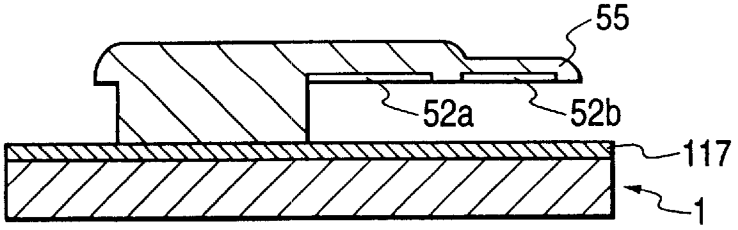

Lastly, the spacer layer 51 was removed by oxygen plasma etching using ECR, and produced on the elemental substrate 1 was a movable member 55 consisting of the metal plating layer 54 (Refer to FIG. 12E).

Figure 13:
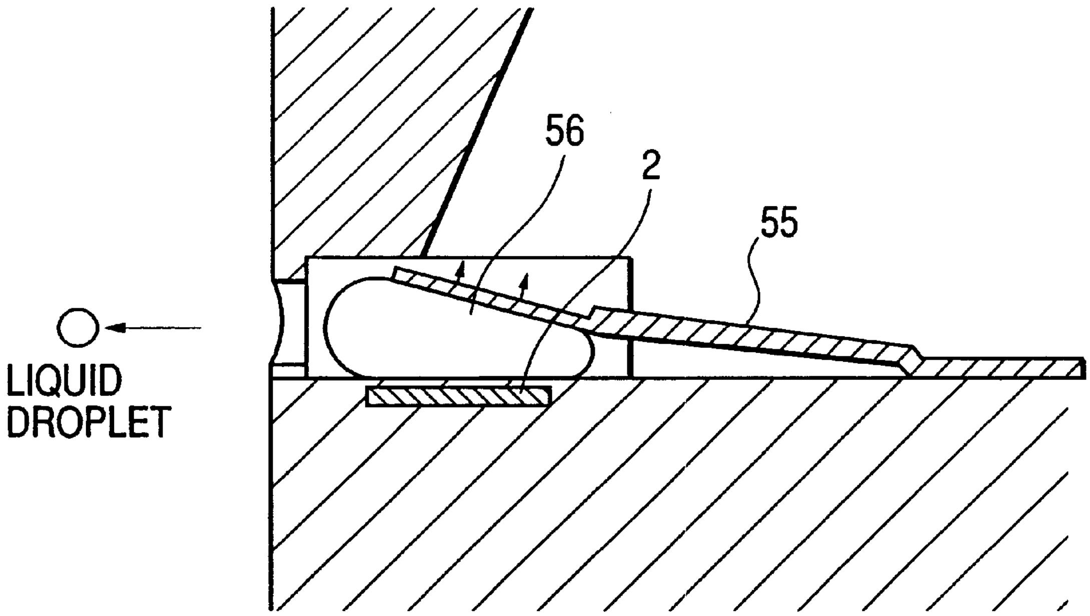
FIG. 13 is a schematic sectional view showing the motion of the movable member produced according to the second embodiment of the method of the present invention, employed for producing a movable member and described with reference to FIGS. 12A, 12B, 12C, 12D and 12E.

As described above, according to this embodiment of the method for producing a micro structure, formed was a movable member 55 having two different levels of thickness and different levels of modulus elasticity along the liquid flow direction of the liquid flow path. The movable member 55 was formed in such a manner that the level of its thickness was lower near its free end than near its supporting point and it could be inflected more near its free end than near its supporting point. As a result, as shown in FIG. 13, when bubbles 56 are generated in the bubble generating area above the heating element 2, with the growth of the bubbles 56, the movable portion near the free end of the movable member 55 is displaced more largely, which improves the efficiency in discharging liquid.

Further, in order to improve the liquid discharging efficiency, a movable member may be constructed such that it has three or more different levels of thickness. The levels of the thickness can be increased only by increasing the number of the latent image layers formed on the spacer layer; therefore, even when a movable member is constructed such that it has three or more different levels of thickness, the number of the process steps of producing a movable member is not increased.

Example 6

FIGS. 14A to 14E illustrate sectional views of a movable member in the liquid discharge head shown in FIG. 7 to illustrate the third embodiment of the method of the present invention for producing thereof.

Figure 14A:
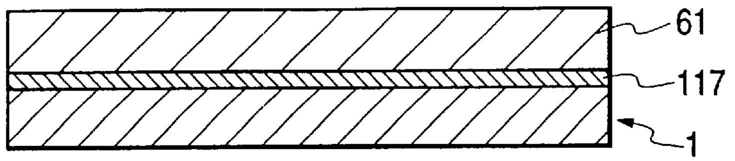
FIGS. 14A, 14B, 14C, 14D and 14E illustrate sectional views of a movable member according to the example 6 of the present invention which is in the liquid discharge head shown in FIG. 7, to illustrate the third embodiment of the method of the present invention for producing thereof.

First, the cavitation resistant film 117 of the elemental substrate 1 was subjected to spin-application of the whole aromatic polyamide acid solution, followed by heat treatment, so as to form a spacer layer 61 consisting of a polyimide thin-film, as shown in FIG. 14A. For the spacer layer 61, used were materials described in the examples 4 and 5.

Figure 14B:
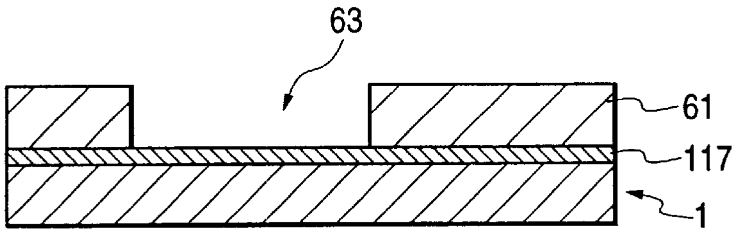

Then, a part of the spacer layer 61 corresponding to the portion supporting and fixing the movable member 65 was removed by the photo lithography process and reactive ion etching by oxygen to provide an aperture 63, so as to expose a part of the cavitation resistant film 117 under the spacer layer 61, as shown in FIG. 14B. This aperture 63 was formed on the upstream side of the liquid flow path 7 (Refer to FIG. 7), in terms of its liquid flow, in the liquid discharge head.

Figure 14C:
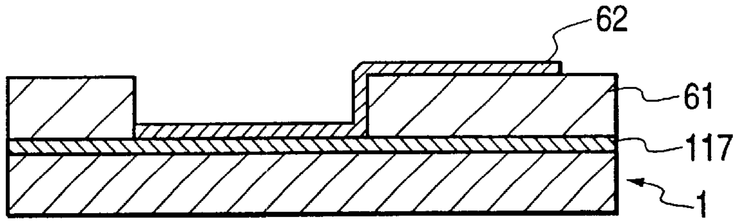
Figure 14D:
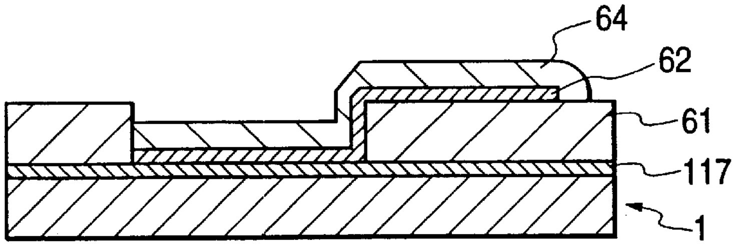

Then, a film of Cr was formed to 50 nm thickness in vacuum by electron beam deposition and subsequently a film of Au was formed to 100 nm thickness in the same vacuum, after that the film was patterned by the photo lithography process and etching, so as to form a latent image layer 62 consisting of an electrically conductive material on the cavitation resistant film 117 and the spacer layer 61 (Refer to FIG. 14C). As a result, the latent image layer 62 was patterned into almost the same shape as the movable member 6.

Then Ni electroplating was performed using the cavitation resistant film 117 as a cathode in Ni plating bath consisting of nickel sulfate, nickel chloride and boric acid at a bath temperature of 50° C. and a cathode current density of 5 $A/cm^2$. The metal plating was deposited on the latent image layer 62. Thus a metal plating layer 64 was formed on the latent image layer 62 (Refer to FIG. 14D).

Figure 14E:
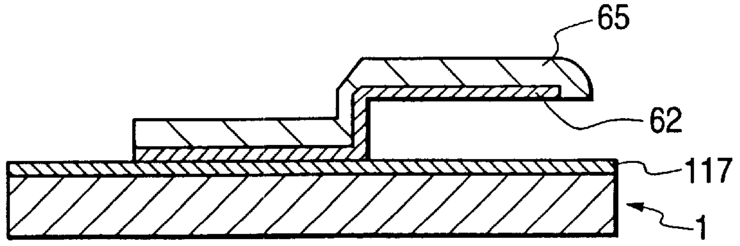

Lastly, the spacer layer 61 was removed by oxygen plasma etching using ECR, and produced on the elemental substrate 1 was a movable member 65 consisting of the metal plating layer 64 (Refer to FIG. 14E).

Figure 15:
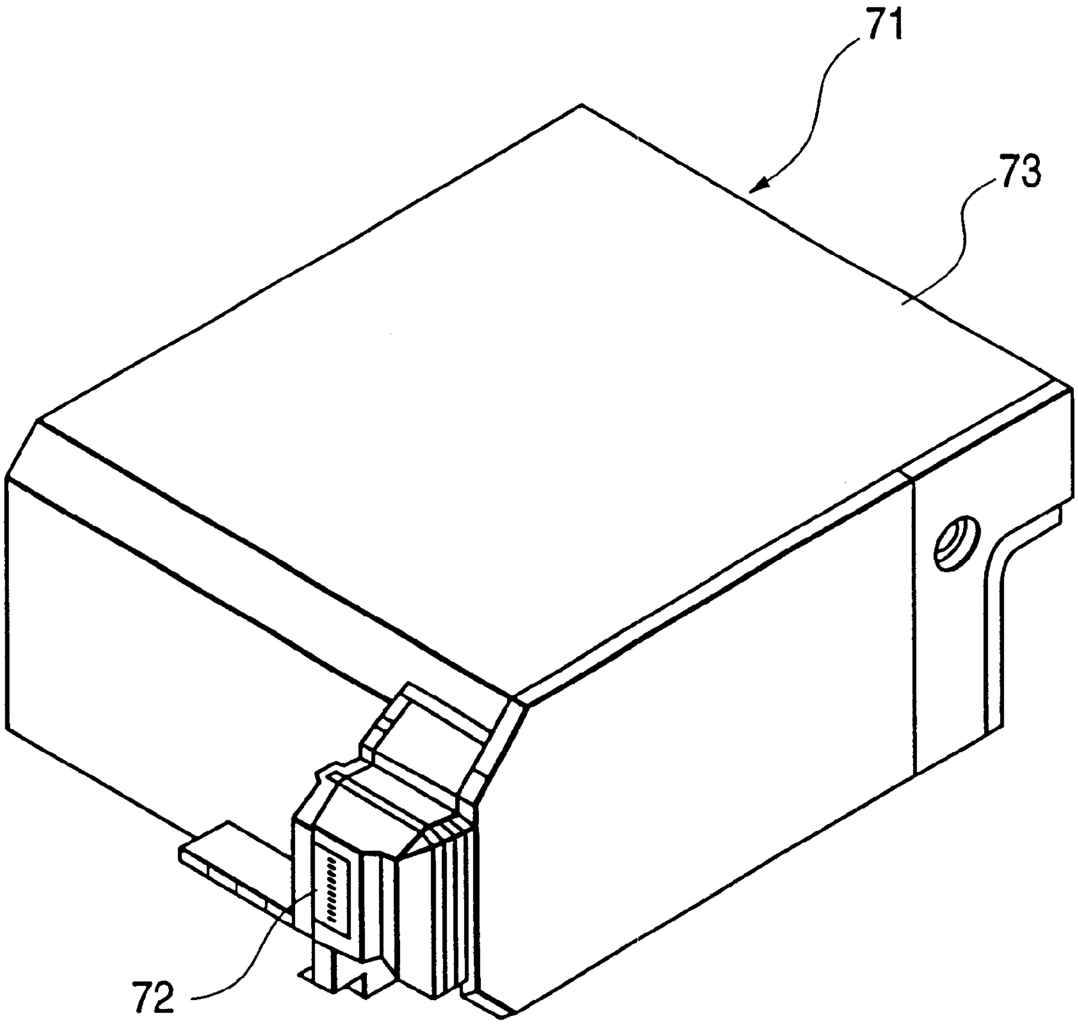
FIG. 15 is a perspective view of a liquid discharge head cartridge loaded with a liquid discharge head of the present invention.

Now, a liquid discharge head cartridge loaded with the foregoing liquid discharge head will be described roughly with reference to FIG. 15. FIG. 15 is a perspective view of a liquid discharge head cartridge loaded with the foregoing liquid discharge head of the present invention.

The liquid discharge head cartridge 71 of the present embodiment has a liquid discharge head 72 described above and a liquid container 73 containing a liquid, such as an ink, supplied to the liquid discharge head 72. The liquid contained in the liquid container 73 is supplied to a common liquid chamber 8 (Refer to FIG. 7) of the liquid discharge head 72 via a liquid supply passage which is not shown in Figures.

The liquid container 73 may be refilled after consuming the liquid contained in it so as to be reused. For this purpose, it is desirable that the liquid container 73 is provided with a liquid injection opening. The liquid discharge head 72 and the liquid container 73 may be constructed integrally or removably.

Figure 16:
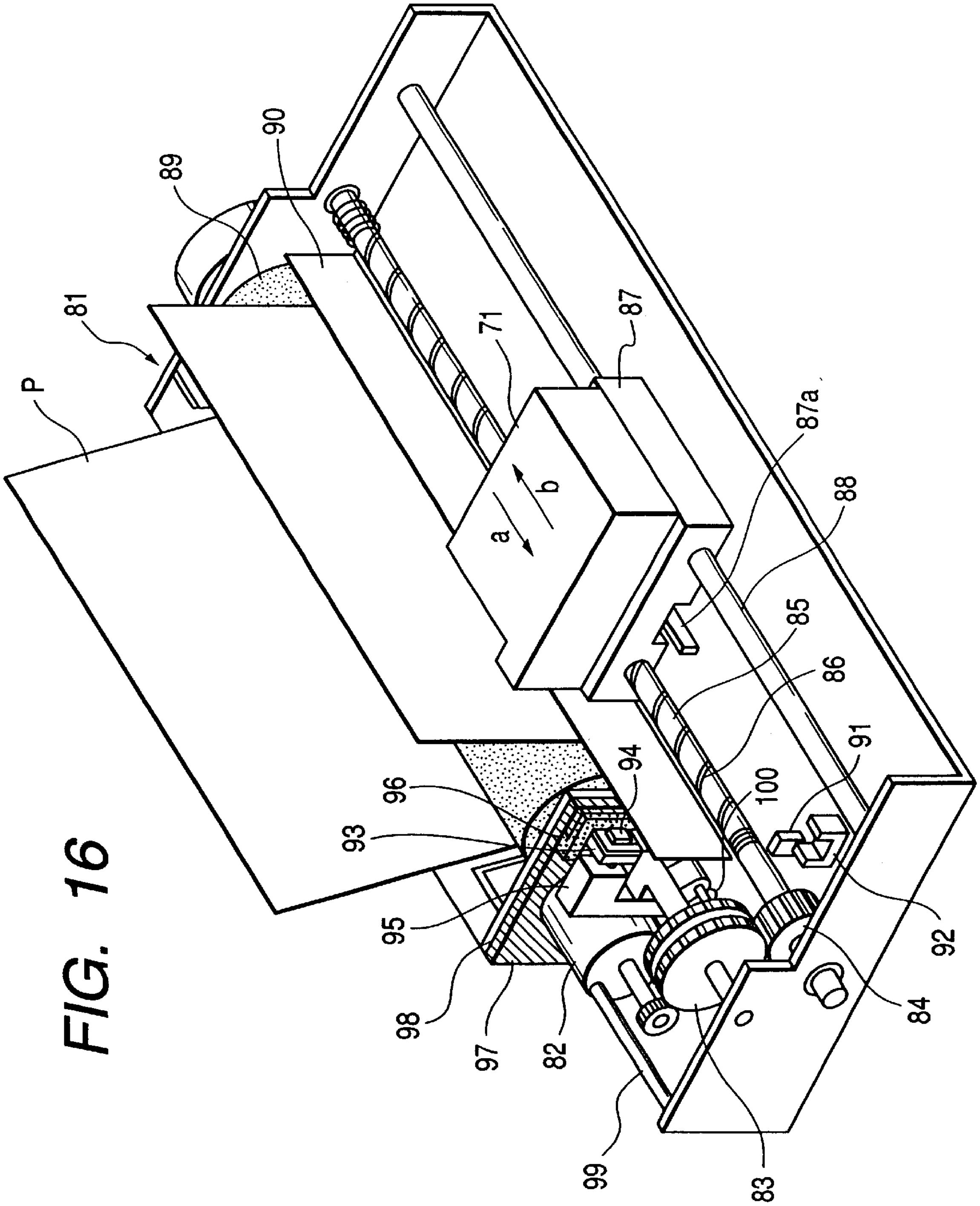
FIG. 16 is a perspective view showing a schematic construction of a liquid discharge device loaded with a liquid discharge head of the present invention.

Then, a liquid discharge device loaded with a liquid discharge head as described above will be described with reference to FIG. 16. FIG. 16 is a perspective view showing a schematic construction of a liquid discharge device loaded with a liquid discharge head as described above.

The liquid discharge device 81 of the present embodiment has a liquid discharge head cartridge 71, as described with reference to FIG. 15, which is loaded on a carriage 87 engaged with a spiral groove 86 of a lead screw 85 which rotates in connection with the normal/reverse rotation of a driving motor 82 via drive transfer gears 83, 84. The liquid discharge head cartridge 71 is moved back and force in the direction of arrows a and b along a guide 88 with the carriage 87 by power of the driving motor 82. A paper bracing plate 90 bracing a recording medium P conveyed on a platen 89 by a recording medium supply device, which is not shown in the figure, presses the recording medium P against the platen 89 over the entire moving area.

Photo couplers 91 and 92 are placed in the neighborhood of the lead screw 85. These are means of detecting a home position for confirming the presence of a lever 87*a* of the carriage 87 to switch the rotational direction of the driving motor 82. In FIG. 16, the reference numeral 93 indicates a support member for supporting a cap member 94 covering the front surface, which is provided with discharge ports, of the liquid discharge head of the liquid discharge head cartridge 71. And the reference numeral 95 indicates a means of suctioning the ink accumulated within the cap member 94 discharged from the liquid discharge head.

The reference numeral 96 indicates a cleaning blade, and the reference numeral 97 indicates a movable member allowing the cleaning blade 96 to move back and forth (vertical to the direction that the above carriage 87 moves). The cleaning blade 96 and the movable member 97 are supported by a body support 98. The form of the cleaning blade 96 is not limited to that described above, but the other known cleaning blades may be also used. The reference numeral 99 indicates a lever for starting suctioning in suction-recovery operation which moves with the movement of a cam 100 engaged with the carriage 87 and controls the movement of the power from the driving motor 82 with a known means such as clutch switching. In the body of the liquid discharge device 81, a recording control portion (not shown in the figure) as a recording signal supply means is provided which gives the heating elements 2 provided in the liquid discharge head (Refer to FIG. 7) a driving signal for discharging liquid and controls the drive of each of the mechanisms described above.

In the liquid discharge device 81, the liquid discharge head discharges liquid against the recording medium P conveyed on the platen 89 by a recording medium conveying device, which is not shown in the figure, while it moves back and forth the entire width of the recording medium P, and recording is achieved by sticking the liquid discharged on the recording medium P.

What is claimed is:

1. A method of producing a micro structure on a substrate which has a support portion and a plate-like portion supported thereby at a distance from said substrate, comprising the steps of:

forming a spacer layer consisting of an insulating material on a substrate having an electrically conductive layer formed on its surface, forming a latent image layer consisting of an electrically conductive material on said spacer layer at a site where said plate-like portion of a structure is to be formed, so that said latent image layer is not in contact with said electrically conductive layer, producing an aperture, where a part of said electrically conductive layer on the surface of said substrate is exposed, on said spacer layer at a site where said support portion of the structure is to be formed, forming a structure layer consisting of a metal plating film formed inside said aperture and on said latent image layer by electroplating said electrically conductive layer as a cathode in said aperture so as to reach said latent image layer, and removing said spacer layer.

2. The method of producing a micro structure according to claim 1 further comprising the step of:

forming a second spacer layer on one site of said latent image layer, wherein said metal plating film is developed to such a height that it can surround said second spacer layer.

3. The method of producing a micro structure according to claim 2 further comprising the step of:

removing a site of said substrate from the back side thereof so as to expose a site of the spacer layer formed on said electrically conductive layer.

4. The method of producing a micro structure according to claim 1, wherein a plurality of said latent image layers are formed leaving a space between them.

5. The method of producing a micro structure according to claim 1 further comprising the step of:

removing said latent image layer after said structure layer is formed.

6. The method of producing a micro structure according to claim 1, wherein said spacer layer consists of a high polymer resin.

7. The method of producing a micro structure according to claim 6, wherein said spacer layer is removed using oxygen plasma.

8. A method of producing a liquid discharge head for discharging liquid from a discharge port, wherein said liquid discharge head has at least a discharge port for discharging liquid, a liquid flow path in communication with said discharge port for supplying said liquid to said discharge port, a substrate provided with a heating element for allowing said liquid filled in said liquid flow path to generate a bubble, and a movable member supported by and fixed to said substrate at a position apart from said substrate and opposite to said heating element with its free end toward said discharge port, and said liquid discharge head discharges said liquid from said discharge port by having the free end of said movable member displaced toward said discharge port around a supporting point constructed in the neighborhood of the portion where said movable member is supported by and fixed to said substrate by pressure generated by generation of said bubble, characterized in that the method comprises the steps of:

forming an electrically conductive layer consisting of an electrically conductive material on said substrate, forming a spacer layer for making a void on said electrically conductive layer, forming a latent image layer consisting of an electrically conductive material on said spacer layer so that said latent image layer can have almost the same shape as said movable member and so that said latent image layer is not in contact with said electrically conductive layer, removing a portion of said spacer layer corresponding to the portion where said movable member is supported and fixed, so as to expose a part of said electrically conductive layer so as to form an aperture on an upstream side of said liquid flow path, in terms of liquid flow from a liquid supply, forming a metal plating layer constituting said movable member on said electrically conductive layer as well as on said latent image layer by electroplating using said electrically conductive layer as a cathode in said aperture so as to reach said latent image layer, and forming said movable member by removing said spacer layer.

9. The method of producing a liquid discharge head according to claim 8, wherein the step of forming a latent image layer consisting of an electrically conductive material on said spacer layer so that the said movable member consists of the step of forming said latent image layer on said spacer layer at a distance therefrom along said liquid flow path in terms of liquid flow direction.

10. The method of producing a liquid discharge head according to claim 8, wherein the step of removing a portion of said spacer layer corresponding to the portion where said movable member is supported and fixed, so as to expose a part of said electrically conductive layer so as to form an aperture on an upstream side of said liquid flow path, in terms of liquid flow from a liquid supply, comprises at least the steps of:

forming an etching mask on said spacer layer leaving the portion of said spacer layer corresponding to said portion where said movable member is supported and fixed, and removing the portion of said spacer layer corresponding to said portion where said movable member is supported and fixed by etching, wherein said latent image layer is used as a part of said etching mask.

11. The method of producing a liquid discharge head according to claim 8, wherein the step of forming a metal plating layer constituting said movable member on said electrically conductive layer as well as on said latent image layer by electroplating using said electrically conductive layer as a cathode comprises the steps of:

forming said portion where said movable member is supported and fixed by developing s aid metal plating layer in said aperture, and forming a metal plating layer constituting said movable member on said electrically conductive layer as well as on said latent image layer by developing said metal plating layer to allow said electrically conductive layer and said latent image layer to be electrically connected.

12. The method of producing a liquid discharge head according to claim 8, wherein high polymer resins are used as a material for said spacer layer.

13. The method of producing a liquid discharge head according to claim 8, wherein the step of removing said spacer layer consists of the step of removing said spacer layer by oxygen plasma.

* * * * *

UNITED STATES PATENT AND TRADEMARK OFFICE
CERTIFICATE OF CORRECTION

PATENT NO. : 6,391,527 B2
DATED : May 21, 2002
INVENTOR(S) : Takayuki Yagi et al.

It is certified that error appears in the above-identified patent and that said Letters Patent is hereby corrected as shown below:

Title page, Item [54], and Column 1, lines 1-3,
"PRODUCTION LIQUID DISCHARGE HEAD" should read -- PRODUCING LIQUID DISCHARGE HEAD, LIQUID DISCHARGE HEAD PRODUCED THEREBY, HEAD CARTRIDGE LOADING WITH LIQUID DISCHARGE HEAD, AND DEVICE FOR DISCHARGING LIQUID PRODUCED THEREWITH --.

Item [56], References Cited, OTHER PUBLICATIONS, in L.C. Kon, et al., … etc., "Kon," should read -- Kong, --.

Column 4,
Line 3, "comprises" should read -- comprising --.

Column 6,
Line 50, "1Oa" should read -- 10a -- (numeric).

Column 20,
Line 25, "the said" should read -- the latent image layer can have almost the same shape as said --.
Line 52, "s aid" should read -- said --.

Signed and Sealed this

Eleventh Day of February, 2003

JAMES E. ROGAN
*Director of the United States Patent and Trademark Office*